(12) United States Patent
Ohmori et al.

(10) Patent No.: US 9,397,288 B2
(45) Date of Patent: Jul. 19, 2016

(54) STORAGE ELEMENT, STORAGE DEVICE, METHOD OF MANUFACTURING STORAGE ELEMENT, AND MAGNETIC HEAD

(71) Applicant: Sony Corporation, Tokyo (JP)

(72) Inventors: Hiroyuki Ohmori, Kanagawa (JP); Masanori Hosomi, Tokyo (JP); Kazuhiro Bessho, Kanagawa (JP); Yutaka Higo, Kanagawa (JP); Kazutaka Yamane, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 39 days.

(21) Appl. No.: 14/299,228

(22) Filed: Jun. 9, 2014

(65) Prior Publication Data

US 2014/0367814 A1 Dec. 18, 2014

(30) Foreign Application Priority Data

Jun. 17, 2013 (JP) ................................. 2013-126388

(51) Int. Cl.
| | |
|---|---|
| *H01L 43/02* | (2006.01) |
| *H01L 43/12* | (2006.01) |
| *H01L 43/08* | (2006.01) |
| *H01L 27/22* | (2006.01) |
| *G11C 11/16* | (2006.01) |

(52) U.S. Cl.
CPC ................ *H01L 43/12* (2013.01); *H01L 43/08* (2013.01); *G11C 11/161* (2013.01); *H01L 27/228* (2013.01)

(58) Field of Classification Search
CPC ....... H01L 27/22–27/228; H01L 43/00–43/14; G11C 11/16–11/161
See application file for complete search history.

(56) References Cited

U.S. PATENT DOCUMENTS

| 7,088,609 | B2 * | 8/2006 | Valet | ...................... H01L 43/08 365/158 |
| 8,493,695 | B1 * | 7/2013 | Kaiser | ..................... H01L 43/08 360/324.12 |
| 2004/0136232 | A1 * | 7/2004 | Hosomi | ................. G11C 11/16 365/158 |
| 2012/0023386 | A1 * | 1/2012 | Oh | .......................... H01L 43/08 714/769 |

FOREIGN PATENT DOCUMENTS

JP 2012-059906 3/2012

* cited by examiner

*Primary Examiner* — Eric Ward
(74) *Attorney, Agent, or Firm* — K&L Gates LLP

(57) ABSTRACT

A storage element includes a layer structure, which includes a storage layer including magnetization perpendicular to the film surface, in which the magnetization direction is changed corresponding to information; a magnetization fixing layer including magnetization perpendicular to the film surface that becomes a reference for information stored on the storage layer; a tunnel barrier layer made from an oxide provided between the storage layer and the magnetization fixing layer; and a spin barrier layer made from an oxide provided contacting the surface of the opposite side of the storage layer to the surface contacting the tunnel barrier layer. A low resistance region is formed in a portion of the spin barrier layer formed with a predetermined set film thickness value and information storage on the storage layer is performed by changing the magnetization direction of the storage layer by current flowing in the stacking direction of the layer structure.

14 Claims, 19 Drawing Sheets

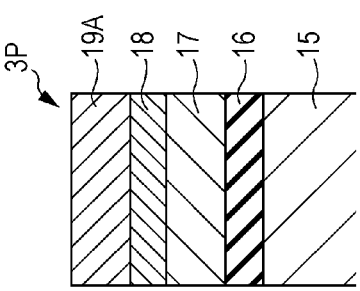
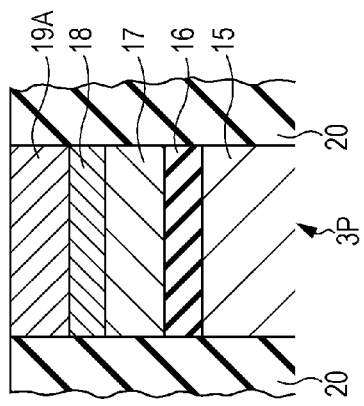
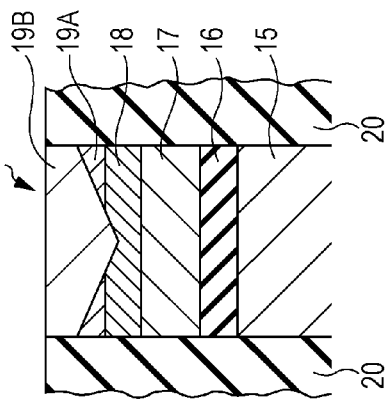
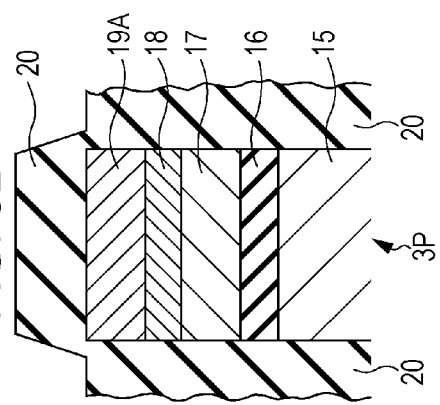
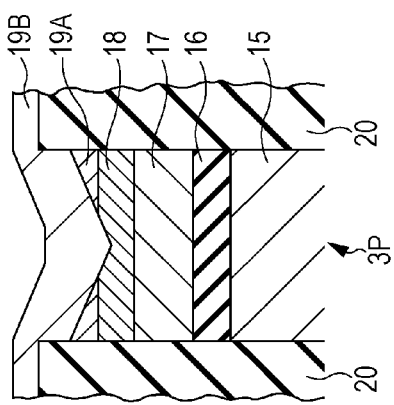
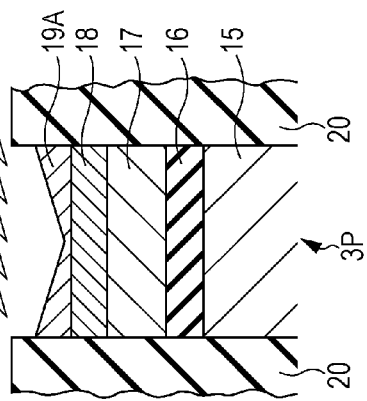

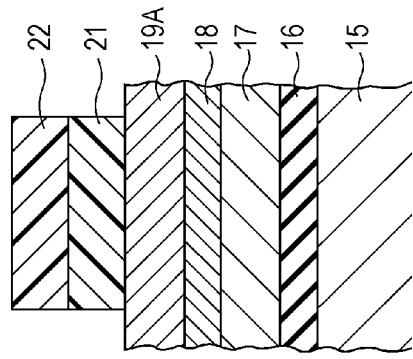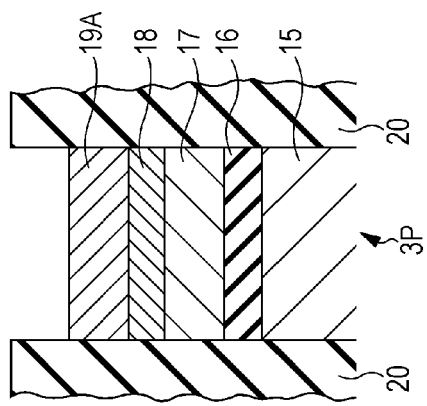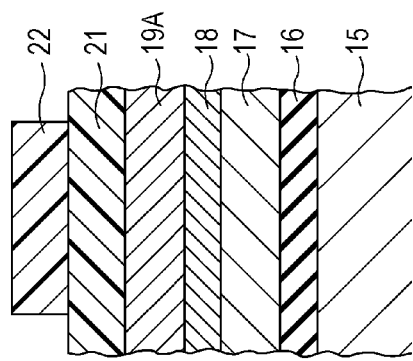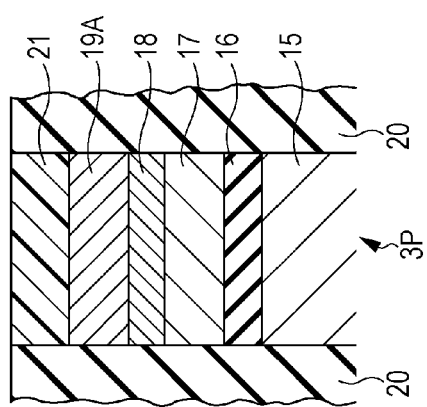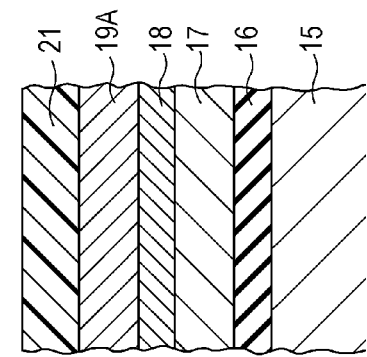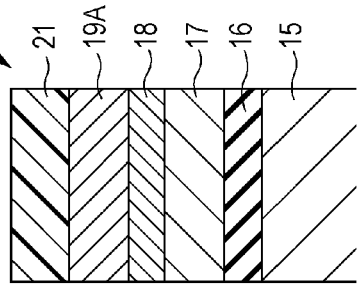

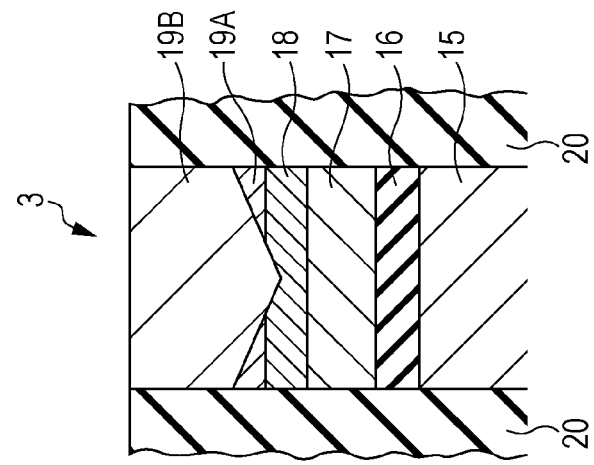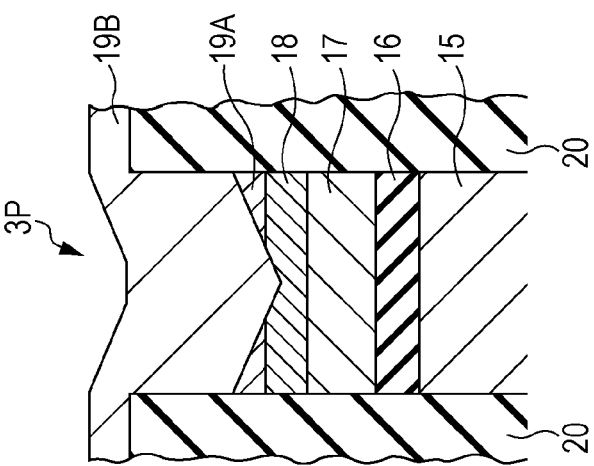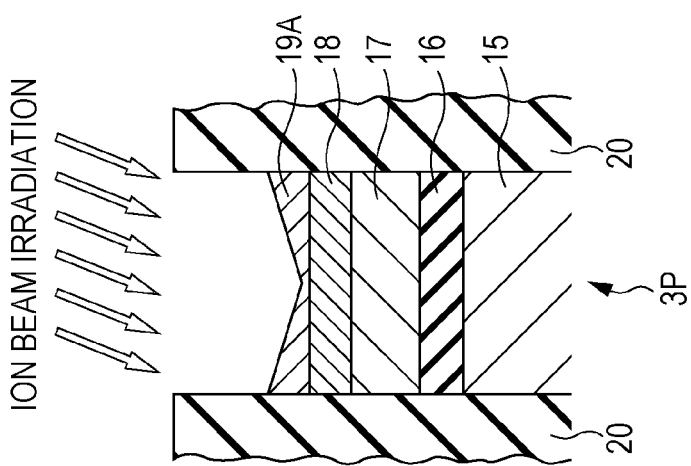

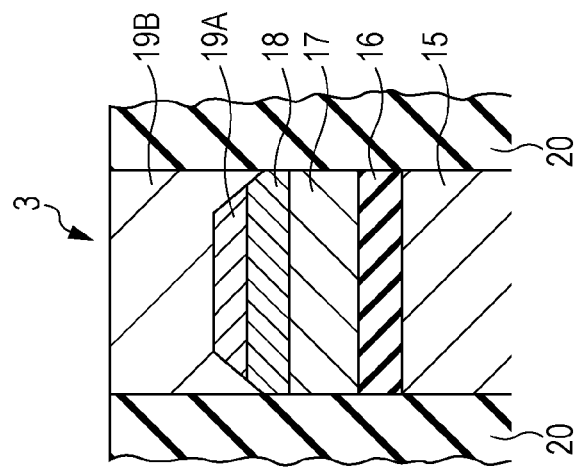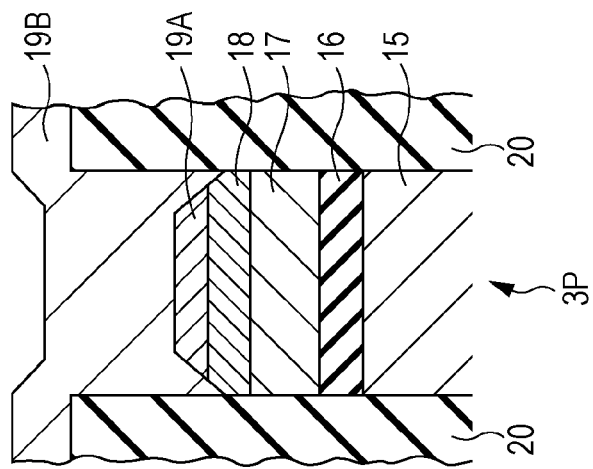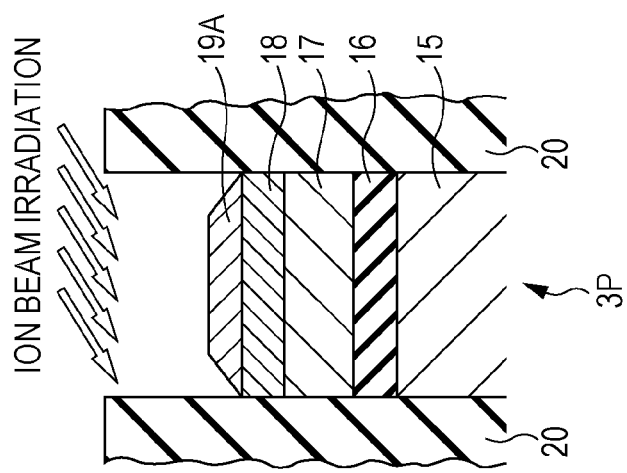

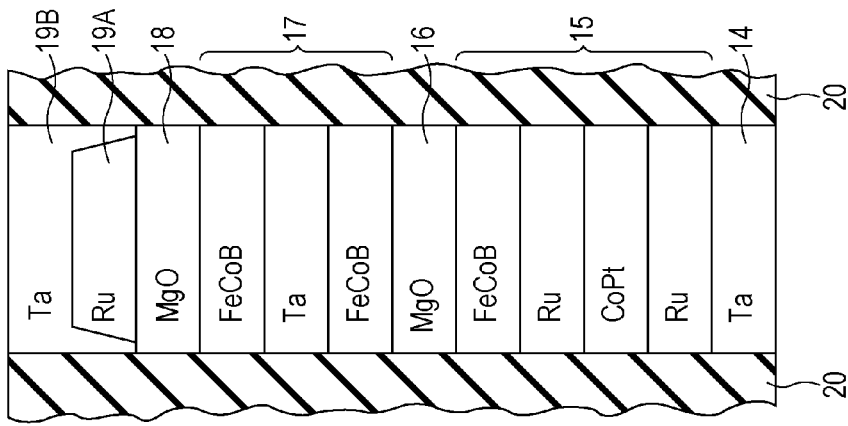
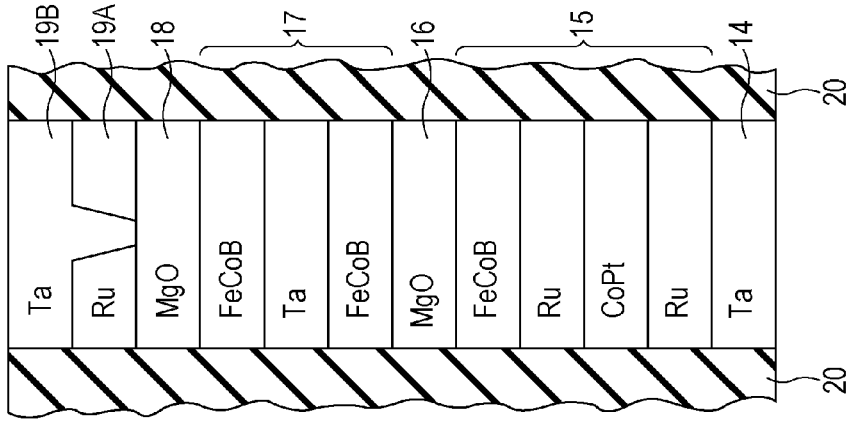
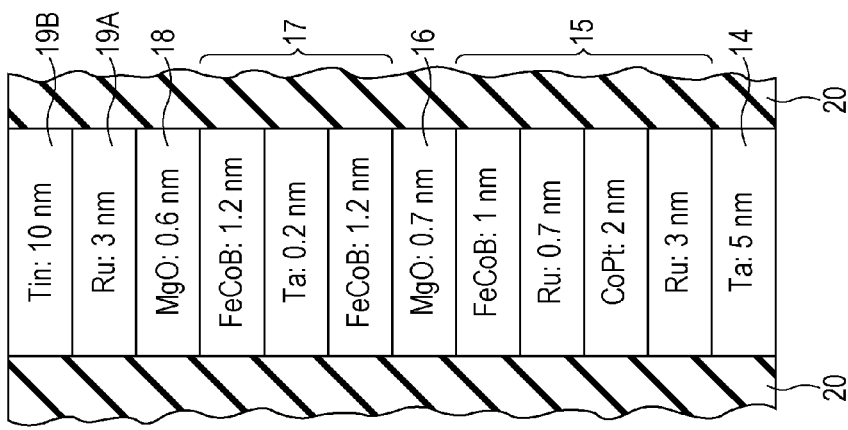

FIG. 16A
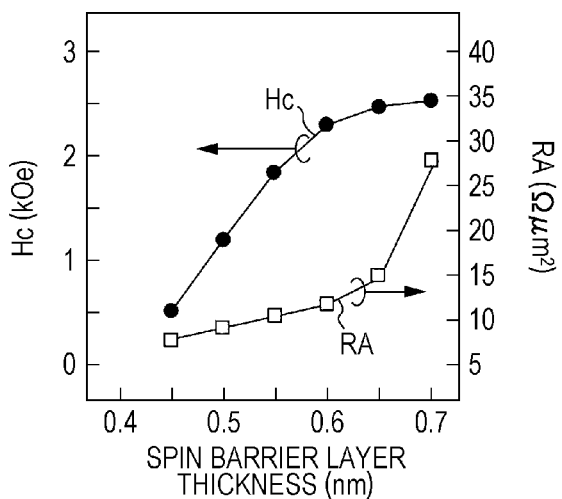
FIG. 16B
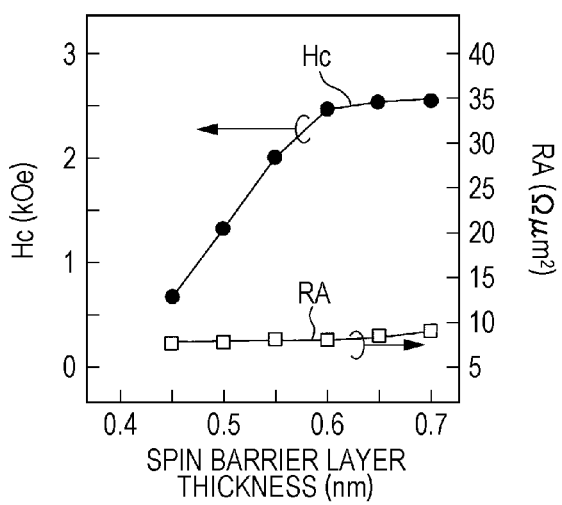
FIG. 16C
| | SAMPLE 1 (COMPARATIVE EXAMPLE) | SAMPLE 2 (EMBODIMENT) | SAMPLE 3 (EMBODIMENT) |
|---|---|---|---|
| RESISTANCE VALUE | 5.6 kΩ | 4.1 kΩ | 3.6 kΩ |
| HOLDING POWER | 2.3 kOe | 2.2 kOe | 2.5 kOe |
| TURNOVER VOLTAGE | 0.4 V | 0.32 V | 0.35 V |
| MR RATIO | 76% | 105% | 112% |

FIG. 18

|  | RA (Ωμm²) | Hc (Oe) |
|---|---|---|
| Ru | 12.2 | 560 |
| Cu | 14.0 | 440 |
| W | 13.4 | 650 |
| Pt | 11.4 | 600 |
| Pd | 13.2 | 530 |
| Cr | 10.2 | 500 |
| TiN | 12.1 | 680 |
| TaN | 13.4 | 580 |
| TiC | 11.9 | 530 |
| ITO | 16.8 | 540 |
| Ti | 4.5 | 210 |
| Ta | 2.5 | IN-PLANE MAGNETIZATION |
| Nb | 3.2 | IN-PLANE MAGNETIZATION |
| Zr | 4.3 | 120 |
| Hf | 2.1 | IN-PLANE MAGNETIZATION |
| Y | 3.3 | 50 |

STORAGE ELEMENT, STORAGE DEVICE, METHOD OF MANUFACTURING STORAGE ELEMENT, AND MAGNETIC HEAD

CROSS REFERENCES TO RELATED APPLICATIONS

The present application claims priority to Japanese Priority Patent Application JP 2013-126388 filed in the Japan Patent Office on Jun. 17, 2013, the entire content of which is hereby incorporated by reference.

BACKGROUND

The present application relates to a storage element that includes a plurality of magnetic layers and performs recording using spin-torque magnetization reversal, a storage device including the storage element, a manufacturing method of the storage element, and further, a magnetic head including the storage element.

Although a high density dynamic random access memory (DRAM) that operates at high speeds is widely used in information devices, such as computers, as a random access memory, there is strong demand for a non-volatile memory as a memory that replaces the DRAM, which is a volatile memory, or as a memory that is used with the DRAM or the like. Magnetic random access memory (MRAM) that records information with the magnetization of a magnetic material has garnered attention as a candidate non volatile memory, and development is progressing.

MRAM recording methods include a method in which the magnetization is reversed by an electromagnetic field and a method in which magnetization reversal is caused by implanting spin polarized electrons directly into the storage layer; however, spin implantation magnetization reversal, which is able to decrease the recording current along with decreasing the size of the element, has garnered attention.

Furthermore, methods using a perpendicular magnetization film in which the magnetization direction of the magnetic material faces a perpendicular direction are being researched in order to miniaturize the element.

In order to form a perpendicular magnetization film, a method of obtaining a perpendicular magnetization film using interface magnetization anisotropy that operates between Fe or Co and an oxide layer is used.

A method for obtaining strong perpendicular magnetic anisotropy is disclosed, for example, in Japanese Unexamined Patent Application Publication No. 2012-59906. That is, obtaining not only interface magnetization anisotropy that operates between a tunnel barrier layer and a storage layer, but also stronger interface magnetization anisotropy by forming another oxide layer (spin barrier layer) on the opposite side of the storage layer to the tunnel barrier layer, is disclosed.

SUMMARY

However, the two layers of the tunnel barrier layer and the spin barrier layer act as a resistance in a magnetic storage element. Therefore, the resistance of the element is raised by providing a spin barrier layer, and the storage operation becomes difficult in the range of operation voltages. Furthermore, since the spin barrier layer does not have magnetic resistance, there is a hindrance when reading out information for which the magnetic resistance ratio of the element is decreased.

It is desirable to provide a storage element having two oxide films of a tunnel barrier layer and a spin barrier layer which lowers the element resistance, and obtains a low writing voltage and large changes in magnetization resistance while suppressing a decrease in the holding characteristics and raising of the recording current.

According to an embodiment of the present application, there is a provided a storage element including a layer structure which includes a storage layer including magnetization perpendicular to the film surface, in which the direction of magnetization is changed corresponding to information; a magnetization fixing layer including magnetization perpendicular to the film surface that becomes a reference for information stored on the storage layer; a tunnel barrier layer made from an oxide provided between the storage layer and the magnetization fixing layer, and a spin barrier layer made from an oxide provided contacting a surface of the opposite side of the storage layer to the surface contacting the tunnel barrier layer. A low resistance region is formed in a portion of the spin barrier layer formed with a predetermined set film thickness value and storage of information on the storage layer is performed by changing the direction of magnetization of the storage layer by current flowing in the stacking direction of the layer structure.

Thereby, a spin barrier layer is formed with an approximately sufficient thickness of the set film thickness value, and the resistance value of a portion of the spin barrier layer is lowered by forming a low resistance region in a portion thereof, while obtaining interface magnetization anisotropy energy.

In the storage element, it is preferable that the spin barrier layer be set as the low resistance region by being formed so that a partial film thickness value is a lower value including a film thickness zero than the set film thickness value.

That is, a portion of the spin barrier layer is formed as a region with a low resistance value with a thinner film thickness than the set film thickness value or a film thickness zero (that is, removed).

In the storage element, it is preferable that an electrode layer be provided on the surface side of the spin barrier layer opposite to the surface that contacts the storage layer, and a portion of the electrode layer be formed so as to enter with respect to the spin barrier layer in the film thickness direction, and formed so that the film thickness value of the entering portion of the spin barrier layer is a lower value than the set film thickness value. By forming the storage element in this way, a portion of the spin barrier layer is made thinner than the set film thickness value.

In the storage element, it is preferable that the electrode layer be formed by a plurality of layers including a first electrode layer and a second electrode layer that are stacked in order from the spin barrier layer side, and a portion of the second electrode layer be formed so as to enter with respect to the spin barrier layer in the film thickness direction after passing through the first electrode layer in the film thickness direction.

It is possible to obtain a layered structure in which the electrode layer enters into the spin barrier layer by a method of stacking the second electrode layer after removing a portion of the first electrode layer and further thinning a portion of the spin barrier layer.

In the storage element, it is preferable that an electrode layer be provided on the surface side of the spin barrier layer opposite to the surface that contacts the storage layer, and a portion of the electrode layer be formed so as to contact the storage layer by passing through the spin barrier layer in the film thickness direction, and formed so that the film thickness value of the passage portion of the spin barrier layer is a lower value than the set film thickness value. That is, a portion of the electrode layer is formed so as to contact the storage layer by removing a portion of the spin barrier layer (film thickness zero).

In the storage element, it is preferable that the electrode layer be formed by a plurality of layers including a first electrode layer and a second electrode layer that are stacked in order from the spin barrier layer side, and a portion of the second electrode layer be formed so as to contact the storage layer by passing through the spin barrier layer in the film thickness direction after passing through the first electrode layer in the film thickness direction.

It is possible to obtain a layer structure in which the electrode layer contacts the storage layer by passing through the spin barrier layer by a method of stacking the second electrode layer after removing a portion of the first electrode layer and further removing a portion of the spin barrier layer.

In the storage element, it is preferable that spin barrier layer be set as the low resistance region by being formed so that the film thickness value is a value lower than the set film thickness value in one or both of a center region and a peripheral region of a film surface.

The center region or the peripheral region of the film surface is easily thinned by etching or the like from, for example, an oblique direction.

In the storage element, it is preferable that the low resistance region be formed by an oxide being reduced in a partial region of the spin barrier layer.

A region with a low resistance value can be generated by a portion of the oxide that configures the spin barrier layer being reduced.

In the storage element, it is preferable that an electrode layer composed of a plurality of layers including a first electrode layer and a second electrode layer in which different materials are stacked in order from the spin barrier layer side be provided on the surface side of the spin barrier layer opposite to the surface that contacts the storage layer, the second electrode layer be made from a material with a higher reactivity to an oxide than the first electrode layer, and the low resistance region be formed by an oxide in a partial region of the spin barrier layer being reduced by a portion of the second electrode layer contacting or approaching the spin barrier layer by passing through or entering the first electrode layer in the film thickness direction.

If the second electrode layer made from a material with a high ionization tendency or the like and a material with a reactivity with oxides, and is set to contact or approach a portion of the spin barrier layer, it is possible to make a partial region of the spin barrier layer a low resistance region in which the oxide is reduced.

In the storage element, it is preferable that the first electrode layer be formed using at least one of Ru, Cu, W, Pt, Pd, Cr, TiN, TaN, TiC and ITO, and the second electrode layer be formed using at least one of Ti, Ta, Nb, Zr, Hf and Y.

Through these materials, it is difficult for the oxide to be reduced in the part of the spin barrier layer that contacts the first electrode layer; meanwhile, it is possible for the oxide to be reduced in the part that contacts or approaches the second electrode layer.

In the storage element, it is preferable that the spin barrier layer be formed using at least one of MgO, $Al_2O_3$, and $SiO_2$.

Interface magnetization anisotropy that acts on the storage layer is favorable obtained by forming the spin barrier layer with these materials.

In the storage element, it is preferable that the set film thickness value be 0.6 nm or more and 0.7 nm or less.

The interface magnetization anisotropy energy is secured and a coercive force is favorably set on the storage layer by setting the film thickness of the spin barrier layer to 0.6 to 0.7 nm.

In the storage element, it is preferable that the storage layer be formed using at least one of FeCoB, FeNiB, FeCoC, FeCoSiB, FeAlSi, CoMnSi and MnAl.

These materials are suitable to perpendicular magnetization of the storage layer.

According to another embodiment of the present application, there is provided a storage device which includes the above-described storage element that holds information according to the magnetization state of a magnetic material, and two types of wiring that intersect one another. The storage element is arranged between the two types of wiring, and a current flows in the stacking direction to the storage element through the two types of wiring.

According to still another embodiment of the present application, there is provided a magnetic head which includes the above-described storage element.

According to still another embodiment of the present application, there is provided a method of manufacturing a storage element, the method including a first step of stacking the magnetization fixing layer, the tunnel barrier layer, the storage layer and the spin barrier layer in order; a second step of stacking a first electrode layer on the spin barrier layer; a third step of filling an insulating material in the periphery of a structure body due to the stacking, and working the upper surfaces of the first electrode layer and the insulating material to be substantially flat, or the upper surface of the insulating material to project further than the upper surface of the first electrode layer; a fourth step of removing or thinning a portion of the first electrode layer, and a fifth step of stacking a second electrode layer on the first electrode layer in which a portion is removed or thinned.

It is possible to comparatively easily manufacture a storage element with the above-described structure by stacking a second electrode layer in the fifth step after a portion of the first electrode layer is worked in the fourth step.

In the method of manufacturing, it is preferable that the spin barrier layer be formed so that the low resistance region is formed by the film thickness value of a portion thereof being set to a lower value than the set film thickness value by thinning or removing a portion of the spin barrier layer after a portion of the first electrode layer is removed in the fourth step.

In so doing, it is possible to obtain a layer structure in which the electrode layer enters into the spin barrier layer.

In the method of manufacturing, it is preferable that a material with a higher reactivity to oxide than the first electrode layer be used in the second electrode layer, and the low resistance region be formed by an oxide in a partial region in the spin barrier layer being reduced by a portion of the second electrode layer that is stacked in the fifth step contacting or approaching the spin barrier layer by passing through or entering the first electrode layer of which a portion is removed or thinned in the fourth step in the film thickness direction.

In so doing, it is possible to generate a region with a low resistance value as a portion of the spin barrier layer.

According to the embodiments of the technology, it is possible to lower the resistance in the element while causing interface magnetization anisotropy to effectively function due to the spin barrier layer in a storage element having two oxide films of a tunnel barrier layer and spin barrier layer on both surface sides of a storage layer, and realize a storage element with excellent storage characteristics and which is able to operate at low power.

Additional features and advantages are described herein, and will be apparent from the following Detailed Description and the figures.

BRIEF DESCRIPTION OF THE FIGURES

FIGS. 7A to 7C are explanatory diagrams of the storage element as tenth, eleventh, and twelfth embodiment;

FIGS. 8A to 8F are explanatory diagrams of a method of manufacturing as a thirteenth embodiment;

FIGS. 9A to 9F are explanatory diagrams of a method of manufacturing as a fourteenth embodiment;

FIGS. 10A to 10C are explanatory diagrams of a method of manufacturing as the fourteenth embodiment;

FIGS. 11A to 11C are explanatory diagrams of a method of manufacturing as a fifteenth embodiment;

FIGS. 15A to 15C are explanatory diagrams of the structure of a test sample;

FIGS. 16A to 16C are explanatory diagrams of the measurement results of a test sample;

FIG. 18 is an explanatory diagram of an example of an electrode material of the embodiment.

DETAILED DESCRIPTION

Below, embodiments will be described in the following order.

1. Configuration of Storage Device and Outline of Storage Element of Embodiment
2. Storage Element of Embodiment (First to Twelfth Embodiments)
3. Manufacturing Method of Embodiment (Thirteen to Seventeenth Embodiments)
4. Testing
5. Summary
6. Modification Examples

1. Configuration of Storage Device and Outline of Storage Element of Embodiment First, the configuration of the storage device that is an embodiment of the present disclosure will be described.

Figure 1:
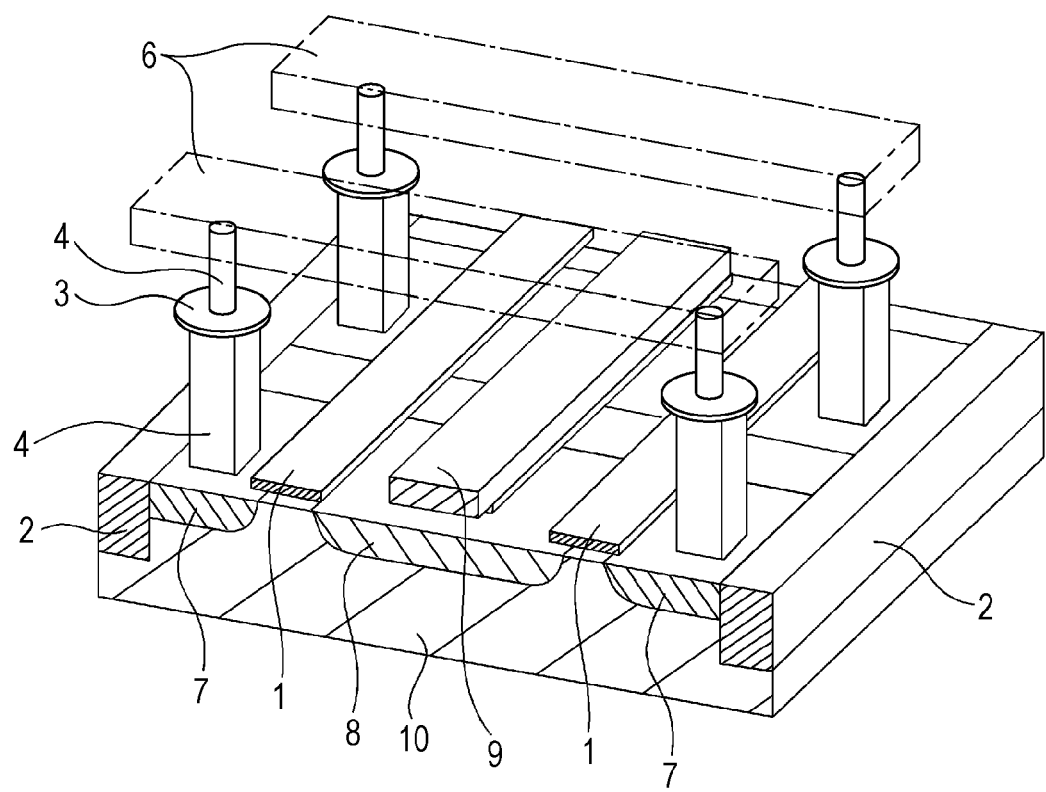
FIG. 1 is an explanatory diagram of a storage device of an embodiment of the technology.
Figure 2:
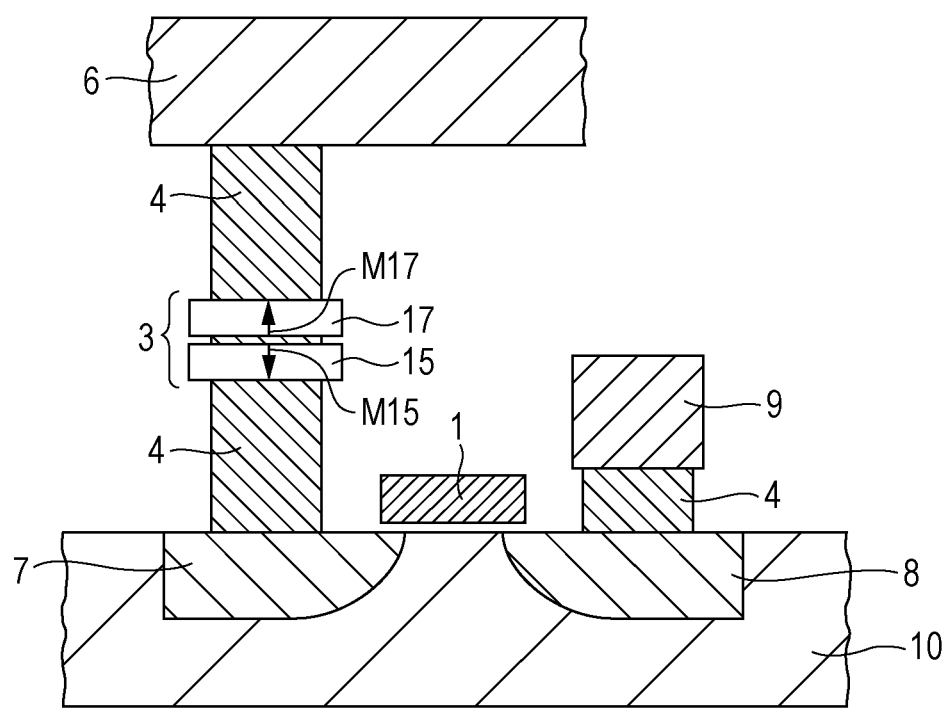
FIG. 2 is an explanatory diagram of a storage device and a storage element of the embodiment.

FIGS. 1 and 2 are schematic diagrams of the storage device of the embodiment. FIG. 1 is a perspective drawing, and FIG. 2 is a schematic cross-sectional view.

As shown in FIG. 1, the storage device of the embodiment is configured by arranging a storage element 3 according to a magnetic random access memory (MRAM) which is able to store information with the magnetization state in the vicinity of the intersection of two types of address wiring (for example, a word line and a bit line) that cross one another.

That is, a drain region 8, a source region 7 and a gate electrode 1 that configure a selection transistor for selecting each storage device are respectively formed on parts isolated by an element isolation layer 2 of a semiconductor substrate 10, such as a silicon substrate. Among these, the gate electrode 1 serves as one address wiring (word line) extending in the front to back direction in the drawing.

The drain region 8 is formed in common with the left and right selection transistors in FIG. 1, and the wiring 9 is connected to the drain region 8.

The storage element 3 having a storage layer that reverses the direction of magnetization through spin-torque magnetization reversal is arranged between the source region 7 and a bit line 6 arranged thereabove extending in the left to right direction in FIG. 1. The storage element 3, for example, is configured by a magnetic tunnel junction element (MTJ element).

As shown in FIG. 2, the storage element 3 has two magnetic layers 15 and 17. The details of the layer structure of the storage element 3 will be described later.

Among the two magnetic layers 15 and 17, one magnetic layer is set as the magnetization fixing layer 15 in which the direction of the magnetization M15 is fixed, and the other magnetic layer is set as a magnetization free layer, that is, the storage layer 17 in which the direction of the magnetization M17 changes.

The storage element 3 is connected to the bit line 6 and the source region 7 via respective vertical contact layers 4.

In so doing, it is possible for a current to flow in the vertical direction in the storage element 3 through the two address wirings 1 and 6, and for the direction of the magnetization M17 of the storage layer 17 to be reversed by spin-torque magnetization reversal.

The "0" and "1" of the information is regulated by the relative angle of the magnetization M17 of the storage layer 17 and the magnetization M15 of the magnetization fixing layer 15.

In such a storage device, it is necessary to perform writing with a current of a saturation current of the selection transistor or lower, and decreasing the current flowing in the storage element 3 by improving the efficiency of the spin transfer is suitable in order to miniaturize the storage device because the saturation current of the transistor lowers with miniaturization.

In order to increase the read out signal, it is necessary to ensure a large rate of change in the magnetic resistance, therefore, applying the MTJ structure as described above, that is, configuring the storage element 3 in which a tunnel insulating layer (tunnel barrier layer) is formed as an intermediate layer between the two magnetic layers 15 and 17 is effective.

In a case in which the tunnel barrier layer is used as such an intermediate layer, a restriction occurs in the amount of current flowing in the storage element 3 in order to prevent an insulation breakdown of the tunnel barrier layer. In other words, from the viewpoint of ensuring reliability with respect to repeated writing of the storage element 3, it is preferable that the necessary current for spin-torque magnetization reversal be controlled. The necessary current for spin-torque magnetization reversal may be referred to as the inversion current, the storage current or the like.

Since the storage device is a non-volatile memory device, stably storing written information according to the current is necessary. That is, it is necessary to secure stability (thermal stability) with respect to temperature variations in the magnetization of the storage layer 17.

When thermal stability of the storage layer 17 is not secured, there are cases in which the reversed direction of magnetization is again reversed due to heat (temperature in the operating environment), thereby resulting in a writing error.

Although the storage element 3 in the storage device has an advantage in scaling, that is, in being able to decrease the volume compared to an MRAM of the related art, decreasing the volume has a tendency towards decreasing the thermal stability, all other characteristics being equal.

In a case in which the capacity of the MRAM continues to increase, since the volume of the storage element 3 significantly decreases, securing the thermal stability becomes a significant problem.

Therefore, in a storage element 3 in an ST-MRAM, the thermal stability is an extremely important characteristic, and it is necessary to design a storage element so that the thermal stability is ensured, even if the volume is decreased.

Next, an outline of the storage element 3 of the embodiment will be described.

The storage element 3 of the embodiment reverses the direction of the magnetization of the storage layer 17 through the above-described spin-torque magnetization reversal, thereby recording information.

The storage layer 17 is configured by a magnetic material including a ferromagnetic layer, and stores information according to the magnetization state (direction of magnetization) of the magnetic material.

Figure 3A:
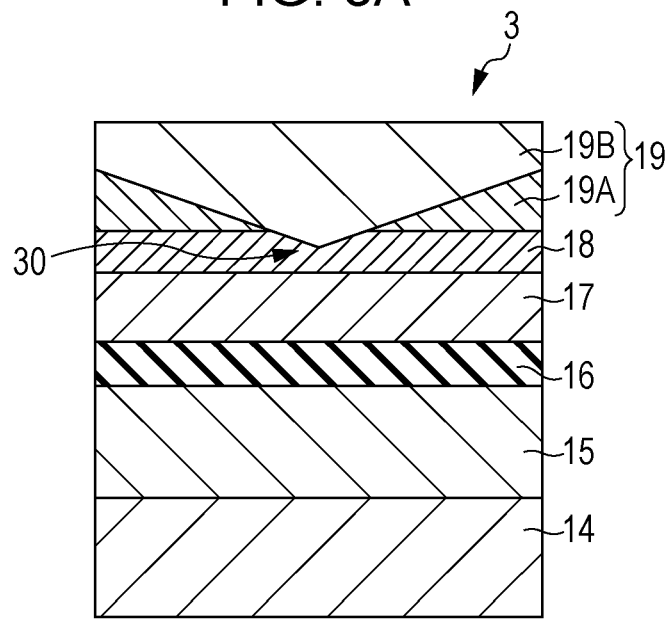
FIGS. 3A and 3B are explanatory diagrams of a storage element as a first embodiment.
Figure 3B:
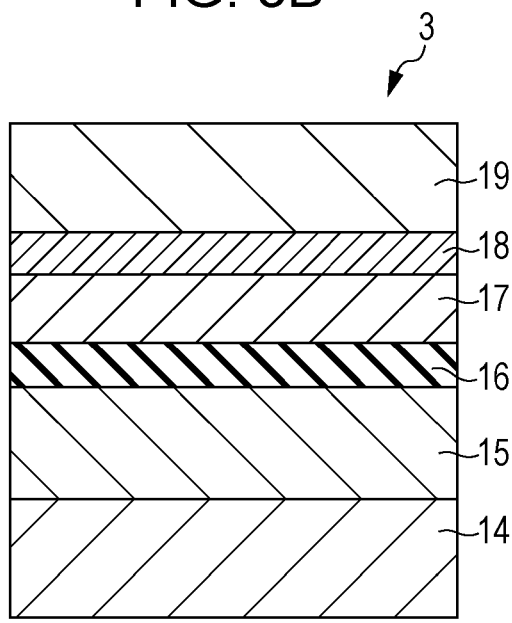

Although the layer structure of the storage element 3 of the embodiment is variously described in FIG. 3A, and FIGS. 4A to 10C (first to twelfth embodiments), considering the ease of comprehension, first the layer structure that is a basis for the embodiment is shown in FIG. 3B, and, thereby, the outline of the storage element 3 assumed in the embodiment will be described. Below, the matters described with reference to the model of the layer structure in FIG. 3B should be interpreted as matters common in the storage element 3 of the first to twelfth embodiments.

The storage element 3 includes at least two of the storage layer 17 and the magnetization fixing layer 15 as ferromagnetic layers, and additionally includes a tunnel barrier layer 16 as an intermediate layer between the two ferromagnetic layers, formed as the layer structure shown in FIG. 3B.

The magnetization fixing layer 15 is layered on the underlayer 14.

A spin barrier layer 18 is provided on the surface side of the storage layer 17 opposite to the tunnel barrier layer 16, and an electrode 19 is further provided on the upper surface thereof.

The storage layer 17 has magnetization perpendicular to the film surface, and the direction of the magnetization is changed corresponding to the information.

The magnetization fixing layer 15 has magnetization perpendicular to the film surface that becomes a reference for the information stored on the storage layer 17.

The tunnel barrier layer 16 is a nonmagnetic material, and is provided between the storage layer 17 and the magnetization fixing layer 15.

The direction of magnetization of the storage layer 17 is changed by implanting spin polarized electrons in the stacking direction of the layer structure having the storage layer 17, the tunnel barrier layer 16 and the magnetization fixing layer 15, thereby information is recorded on the storage layer 17.

Here, the spin-torque magnetization reversal will be simply described.

Electrons have two types of spin angular momentum. For example, these are defined as up and down. In the interior of the non-magnetic material, the same number of both is present, and there is a difference in the numbers of both in the interior of the ferroelectric material. In the magnetization fixing layer 15 and the storage layer 17 that are the two layers of ferromagnetic body that configure the ST-MRAM, a case in which electrons are moved from the magnetization fixing layer 15 to the storage layer 17 when the directions of the magnetic moment are in opposite direction to one another will be considered.

The magnetization fixing layer 15 is a fixed magnetic layer in which the direction of the magnetic moment is fixed for a high coercive force.

A spin polarization, that is, a difference in the numbers of up and down, occurs in the electrons passing through the magnetization fixing layer 15. When the thickness of the tunnel barrier layer 16 that is a non-magnetic layer is configured to be sufficiently thin, the electrons reach the other magnetic body, that is, the storage layer 17 before attaining an unpolarized condition (the same number of up and down) in normal non-magnetic material by the spin polarization being relaxed due to passing through the magnetization fixing layer 15.

In the storage layer 17, by reversing the encoding of the degree of spin polarization, a portion of the electrons are reversed, that is, the direction of the spin angular momentum is changed, in order to lower the energy of the system. At this time, because the total angular momentum of the system is conserved, the total change in angular momentum and the equivalent reaction due to electrons for which the direction is changed is also applied to the magnetic moment of the storage layer 17.

In a case in which the current, that is number of electrons passing through in a unit time, is low, although the change in angular momentum in the magnetic moment of the storage layer 17 is small because the total number of electron in which the direction changes is small, it is possible to provide a large change in angular momentum within a unit time when the current is increased.

The time change in angular momentum is torque, and precession of the magnetic moment of the storage layer 17 begins when the torque exceeds a given threshold, and becomes stable at 180 degrees of rotation due to uniaxial anisotropy thereof. That is, reversal occurs from a reverse direction state to same direction state.

If the current flows oppositely in a direction in which electrons are fed from the storage layer 17 to the magnetization fixing layer 15 when the magnetization is in the same direction state, torque is applied when spin reversed electrons next enter the storage layer 17 when reflected by the magnetization fixing layer 15, and it is possible for the magnetic moment to be reversed to the reverse direction state. However, in this case, the amount of current necessary to cause the reversal becomes greater than in a case of being reversed from the reverse direction state to the same direction state.

Although reversal of the magnetic moment from the same direction state to the reverse direction state is difficult to intuitively understand, it may be thought of as the storage layer 17 being reversed in order to conserve the angular momentum of the entire system, without reversing the magnetic moment for the magnetization fixing layer 15 being fixed. In this way, the recording of 0/1 is performed by a current of a given threshold or higher flowing from the magnetization fixing layer 15 in the direction of the storage layer 17, or the reverse direction, corresponding to the respective polarities.

Reading out of the information is performed using the magnetic resistance effect, similarly to an MRAM of the related art. That is, a current flows in a direction perpendicular to the film surface similarly to the case of the above-described recording. A phenomenon is utilized in which the electrical resistance exhibited by the element changes according to whether the magnetic moment of the storage layer 17 is in the same direction or the reverse direction with respect to the magnetic moment of the magnetization fixing layer 15.

Although the material used as the tunnel barrier layer 16 between the magnetization fixing layer 15 and the storage layer 17 may be either a metal or an insulator, cases where an insulator is used as the tunnel barrier layer 16 makes obtaining a higher read out signal (rate of change in resistance) and recording with a lower current possible. The element at this time is referred to as a ferromagnetic tunnel junction (MTJ).

When the direction of magnetization of the magnetic layer is reversed using spin-torque magnetization reversal, the threshold Ic of the current that is necessary differs according to whether the easy axis of magnetization of the magnetic layer is in the in-plane direction or in the perpendicular direction.

Although the storage element 3 of the embodiment is a perpendicular magnetization type, the reverse current in which the direction of magnetization of the magnetic layer is reversed in the case of an in-plane magnetization storage element of the related are is set to IC_para.

A case of being reversed from the same direction to the reverse direction becomes, $$Ic\_para = (A \cdot \alpha \cdot Ms \cdot V/g(0)/P)(Hk+2\pi Ms)$$

and a case of being reversed from the reverse direction to the same direction becomes $$Ic\_para = (A \cdot \alpha \cdot Ms \cdot V/g(\pi)/P)(Hk+2\pi Ms)$$

Here, the same direction and reverse direction are the magnetization direction of the storage layer 17 with the magnetization direction of the magnetization fixing layer 15 is taken as a reference. This may also be referred to as parallel and antiparallel.

Meanwhile, when a reverse current of the perpendicular magnetization storage element 3 as in the embodiment is Ic_perp, a case of being reversed from the same direction to the reverse direction becomes $$Ic\_perp = (A \cdot \alpha \cdot Ms \cdot V/g(0)/P)(Hk-4\pi Ms)$$

and a case of being reversed from the reverse direction to the same direction becomes $$Ic\_perp = (A \cdot \alpha \cdot Ms \cdot V/g(\pi)/P)(Hk-4\pi Ms).$$

Here, A is a constant, α is a damping constant, Ms is the saturation magnetization, V is the element volume, P is the spin polarizability, g(0) and g(π) are coefficients corresponding to the efficiency at which spin torque is transmitted to the other magnetic layer when in the same direction and the reverse direction respectively, and Hk is the magnetic anisotropy.

In each of the above formulae, it can be understood that the perpendicular magnetization type is suitable due to decreased storage current when comparing (Hk−4πMs) in a case of a perpendicular magnetization type to a (Hk+2πMs) in a case of an in-plane magnetization type.

The reverse current Ic0 is represented by the following (Equation 1) that represents the relationship with the index Δ of the thermal stability.

$$I_C0 = \left(\frac{4ek_BT}{\hbar}\right)\left(\frac{\alpha\Delta}{\eta}\right) \quad \text{Equation 1}$$

Here, e is the electron charge, η is the spin implantation efficiency, the h-bar is the reduced Planck constant, α is a damping constant, $k_B$ is the Boltzmann constant, and T is the temperature.

In order to be a memory device, the device has to be able to hold written information. An index of the ability to hold information is determined by the value of index Δ (=KV/$k_B$T) of the thermal stability. This A is represented by (Equation 2).

$$\Delta = \frac{KV}{k_BT} = \frac{M_S V H_K}{2k_BT} \quad \text{Equation 2}$$

Here, Hk is the effective anisotropy field, $k_B$ is the Boltzmann constant, T is the temperature, Ms is the amount of saturation magnetization, V is the volume of the storage layer, and K is the anisotropy energy.

The effects of the magnetic shape anisotropy, the induced magnetic anisotropy, the crystal magnetic anisotropy and the like are incorporated in the effective anisotropy field Hk, and this becomes equivalent to the coercive force in a case in which a single domain simultaneous rotation model is assumed.

The index Δ of the thermal stability and threshold Ic of the current often have a trade off relationship. Therefore, establishing both often becomes a problem in maintaining the memory characteristics.

The threshold of the current in which the magnetization state of the storage layer is changed is, in practice, for example, approximately a hundred to several hundred μA in a circular tunneling magneto-resistance (TMR) element in which the thickness of the storage layer 17 is 2 nm, and the diameter of the planar pattern is 100 nm.

In contrast, it is necessary that the write current be several mA or higher in an ordinary MRAM that performed magnetization reversal by the current magnetic field.

Accordingly, in the case of a spin-torque magnetization reversal MRAM of the embodiment, it is understood that the power consumption of an integrated circuit is effectively reduced because the threshold of the above-described write current is sufficiently reduced.

Because the wiring for generating a current magnetic field that is necessary in an ordinary MRAM becomes unnecessary, there is an advantage in the degree of integration compared to the ordinary MRAM.

In a case of performing spin-torque magnetization reversal, since writing (recording) of information is performed by a current flowing directly to the storage element, the memory cell is configured by connecting the storage element to a selection transistor in order to select the memory cell to which writing is performed.

In this case, the current which flows to the storage element is controlled according to the magnitude of the current (saturation current of the selection transistor) able to flow by the selection transistor.

In order for the recording current to be reduced, it is preferable that the above-described perpendicular magnetization be adopted.

Because it is possible for the perpendicular magnetization film to generally have higher magnetic anisotropy than the in-plane magnetization film, it is preferable that the above-described Δ also be maintained to be large.

In magnetic materials having perpendicular anisotropy, although there are several variations, such as rare earth transition metal alloys (such as TbCoFe), metal multilayer films (such as Co/Pd multilayer films), ordered alloys (such as FePt), and the use of interface anisotropy between an oxide and a magnetic metal (such as Co/MgO), it is preferable that rare earth transition metal alloys be not used as the MRAM material of the embodiment because of the loss of perpendicular magnetic anisotropy when diffused and crystallized due to heating.

It is known that the metal multilayer film is also diffused by heating, thereby decreasing perpendicular magnetic anisotropy, and further because expressing perpendicular magnetic anisotropy is a case of (111) alignment of a face centered cubic, it becomes difficult to realize (001) alignment demanded in MgO or a high spin polarizability layer, such as Fe, CoFe and CoFeB, that is arranged adjacent thereto. Because L10 ordered alloys are stable at high temperature, and express perpendicular magnetic anisotropy during (001) alignment, although the above-described problem does not occur, it is necessary that the atoms be regulated and aligned by heating to a sufficiently high temperature of 500° C. or higher during manufacturing or performing thermal processing at a high temperature of 500° C. or above after manufacturing, and there is a possibility of undesirable diffusion of increases in interface roughness in other part of a layered film, such as a tunnel barrier.

In contrast, it is difficult for any of the above problems to occur in those in which a Co-based or Fe-based material as the storage layer 17 is stacked on a material in which interface magnetization anisotropy is used, that is, MgO that is the tunnel barrier layer 16, and therefore the structure looks promising as a storage layer material.

The storage element 3 of the embodiment obtains a perpendicular magnetization film by using interface anisotropy that operates between a Co-based or Fe-based material and an oxide layer.

In order for strong perpendicular magnetic anisotropy to be obtained, not only the interface magnetization anisotropy that operates between the tunnel barrier layer 16 and the storage layer 17, but also another oxide layer (for example, the spin barrier layer 18 made from MgO) is formed on the opposite side of the storage layer 17 to the tunnel barrier layer 16 side.

That is, the storage layer 17 made from a Co-based or Fe-based material is configured to contact the oxide film both sides thereof.

For example, FeCoB is used in the storage layer 17. When the FeCoB of the storage layer 17 contacts the MgO film and the film thickness of the FeCoB film is within a given fixed range, the FecoB film becomes a perpendicular magnetization film.

The origin of the perpendicular magnetic anisotropy is the interface magnetization anisotropy energy that is generated in the interface of the FeCoB film and the MgO film. If set such that the CoFeB film of the storage layer 17 contacts the MgO film on both the upper and lower surfaces, and interface magnetization anisotropy energy is obtained in both the upper and lower surface, it is possible for the perpendicular magnetic anisotropy of the storage layer 17 to be doubled.

On the other hand, using the perpendicular magnetization magnetic material having interface magnetization anisotropy in the magnetization fixing layer 15 shows promise. In particular, in order to provide a large reading signal, magnetic materials that include Co or Fe being stacked below the tunnel barrier layer 16 (for example, MgO layer) shows promise.

Although the structure of the magnetization fixing layer 15, even in a single layer, may use a stacked ferri-pinned structure formed from two or more ferromagnetic layers and non-magnetic layers, ordinarily a stacked ferri-pinned structure formed from two layers of a ferromagnetic layer and a non-magnetic layer (Ru) is often used.

Examples of merits of making the magnetization fixing layer 15 a stacked ferri-pinned structure are being able to easily cancel asymmetry of the thermal stability with respect to the information writing direction, and being able to improve the stability with respect to the spin torque.

In the embodiment, in consideration of the saturation current value of the selection transistor, a magnetic tunnel junction (MTJ) element is configured using the tunnel barrier layer 16 of a non-magnetic insulator between the storage layer 17 and the magnetization fixing layer 15.

By configuring the magnetic tunnel junction (MTJ) element using the tunnel insulating layer, it is possible to increase the magneto-resistance change rate (MR ratio) compared to a case of configuring a giant magneto-resistance effect (GMR) element using a non-magnetic conductive layer, and therefore possible to increase the readout signal intensity.

In particular, it is possible to increase the magneto-resistance change rate (MR ratio) by using magnesium oxide (MgO) as the material of the tunnel insulating layer 16.

The efficiency of the spin transfer is generally dependent on the MR ratio, and the efficiency of the spin transfer increases as the MR ratio increases, thereby it is possible to decrease the magnetization reversal current density.

Accordingly, by using magnesium oxide as the material of the tunnel insulating layer, and using the storage layer 17 of FeCoB or the like at the same time, it is possible to reduce the write threshold current due to spin-torque magnetization reversal, and possible to perform writing (recording) of information with a low current. It is possible to increase intensity of the read out signal.

In so doing, the MR ratio (TMR ratio) is ensured, and it is possible to reduce the write threshold current due to spin-torque magnetization reversal, and possible to perform writing (recording) of information with a low current. It is possible to increase intensity of the read out signal.

In a case of forming the tunnel insulating layer in this way using a magnesium oxide (MgO) film, it is more desirable that the MgO film be crystallized, and the crystal orientation be maintained in the 001 direction.

In the embodiment, the storage layer 17 may be formed with a single material, such as FeCoB, FeNiB, FeCoC, FeCoSiB, FeAlSi, CoMnSi and MnAl, or they may be combined to form the storage layer 17. Furthermore, non-magnetic materials, such as Ta, V, Nb, Cr, W, Mo, Ti, Zr, and Hf, may be combined therewith to form the storage layer 17.

Using a magnetic body, such as CoFe, in which the magnetization facing in one direction due to magnetic exchange coupling between an antiferromagnetic body, such as PtMn, RhMn, and IrMn, and a ferromagnetic body, or a magnetic body with a high coercive force, such as CoPt, FePt, TbFeCo, SmCo, and MnAl, as the magnetization fixing layer 15, such that it becomes difficult for the magnetization to move, is suitable. These may be used by being magnetically coupled with CoFe, FeCoB, CoMnSi and CrMnSi or the like with a strong magneto-resistance effect to be antiparallel due to magnetic coupling that operates via a non-magnetic body, such as Ru, Re and Rh.

The tunnel barrier layer 16 and the spin barrier layer 18 may use MgO, $Al_2O_3$, $SiO_2$ or the like.

It is desirable that the area resistance value of the tunnel barrier layer 16 be controlled to be approximately several tens of Ωμm² or less, from the viewpoint of obtaining the necessary current density in order that the direction of magnetization of the storage layer 17 be reversed by spin-torque magnetization reversal. In the tunnel barrier layer 16 formed from, for example, an MgO film, it is desirable that the film thickness of the MgO film be set to 1.5 nm or less in order to set the area resistance value to the above-described range.

The electrode layer 19 may use Ta, Ru, W, TiN, Cu or the like.

The underlayer 148 may use various metals, such as Ta, Ti, W, and Ru, and conductive nitrides, such as TiN. The underlayer 14 may be a single layer, or a plurality of layers of different materials may be stacked.

It is preferable that the shape of the element be elliptical in the case of in-plane magnetization, a circular shape is preferable in a case of perpendicular magnetization such as the present example.

It is desirable that storage element be reduced such that the direction of magnetization of the storage layer 17 is easily reversed with a low current. Accordingly, it is preferable that the area of the storage element be 0.01 μm² or less.

Ion milling may be used as the etching method for forming the element, or the element may be formed by reactive ion etching, or these may be combined. The periphery of the storage element 3 is embedded with an insulator such as Al₂O₃, SiO₂, and AlN after formation of the storage element 3 as described above, thereby forming an upper wiring, and writing and reading out is performed by a current flowing in the vertical direction of the element.

2. Storage Element of Embodiment

First to Twelfth Embodiments

Next, a specific configuration of the storage element 3 of the embodiment will be described as first to twelfth embodiments.

The storage element 3 of the first to twelfth embodiments basically includes an underlayer 14, a magnetization fixing layer 15, a tunnel barrier layer 16, a storage layer 17, a spin barrier layer 18, and an electrode layer 19, similarly to the layer structure shown in FIG. 3B. In particular, by arranging the tunnel barrier layer 16 and the spin barrier layer 18 as oxide layers on both sides of the storage layer 17, the configuration obtains strong interface magnetization anisotropy.

The spin barrier layer 18 has an effect in which the storage characteristics of information are improved by improving the coercive force of the storage layer 17, and an effect in which the efficiency of the spin torque is improved. Therefore, the spin barrier layer 18 is effective in order to prepare a magnetic memory with low power consumption at a high density.

Incidentally, in a case in which a current flows to the storage element 3 formed as above, the two layers of the tunnel barrier layer 16 and the spin barrier layer 18 contribute to the electrical resistance, thereby increasing the resistance. Since the spin barrier layer 18 does not have magnetic resistance, a decrease in the magnetic resistance occurs.

That is, the resistance of the storage element 3 rises and recording is difficult in the range of the operating voltage, and further, the magnetic resistance rate of the storage element 3 decreases, thereby causing hindrance when reading out information.

Here, the storage element 3 of the first to twelfth embodiments is able to suppress a rise in the element resistance due to the spin barrier layer 18 while obtaining an interface magnetization anisotropy effect due to the spin barrier layer 18, based on the concept of the basic layer structure in FIG. 3B. More specifically, the electrical resistance of a portion of the spin barrier layer 18 is lowered, the electrical resistance is lowered while maintaining the some extent of the spin barrier effect, and the magnetic resistance rate is increased.

In order for the electrical resistance of a portion of the spin barrier layer 18 to be lowered, a method is employed in which a portion of the spin barrier layer 18 is thinned, or a portion of the spin barrier layer 18 is reduced.

Storage Element of First

Second and Third Embodiments

FIG. 3A shows the layer structure of the storage element 3 of the first embodiment. As depicted in the drawing, the underlayer 14, the magnetization fixing layer 15, the tunnel barrier layer 16, the storage layer 17, the spin barrier layer 18 and the electrode layer 19 are included. The electrode layer 19, for example, is configured by a first electrode layer 19A and the second electrode layer 19B made from different materials.

In this case, although the spin barrier layer 18 is formed with a predetermined set film thickness value (for example, a film thickness value of 0.6 nm or more and 0.7 nm or less), a low resistance region 30 is formed in a portion (peripheral region of the film surface) of the spin barrier layer 18.

In this case, the low resistance region 30 is a region in which the film thickness value of a portion (center region) of the spin barrier layer 18 is a lower value than the set film thickness value, and, more specifically, is a region in which the film thickness is thinned.

In the thin film region as the low resistance region 30, a portion of the electrode layer 19 attains a state of entering into the spin barrier layer 18 in the film thickness direction, as shown in the drawing. More specifically, each layer is formed so that a portion of the second electrode layer 19B enters in the center portion of the film surface of the spin barrier layer 18 in the film thickness direction after passing through the first electrode layer 19A in the film thickness direction, and the center portion of the spin barrier layer 18 becomes the low resistance region 30 of the thin film.

Figure 4A:
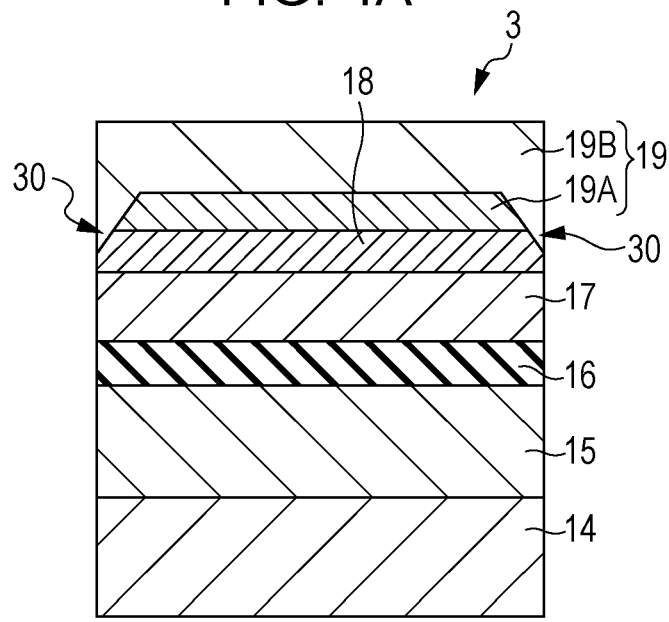
FIGS. 4A and 4B are explanatory diagrams of storage element as second and third embodiment.

FIG. 4A shows the layer structure of the storage element 3 of the second embodiment.

In this case, although the spin barrier layer 18 is formed with a predetermined set film thickness value (for example, a film thickness value of 0.6 nm or more and 0.7 nm or less), a low resistance region 30 is formed in a portion (center region of the film surface) of the spin barrier layer 18. Similarly to the first embodiment, the low resistance region 30 is a portion of the spin barrier layer 18 that is thin film region in which the film thickness value is a lower value than the set film thickness value.

In the thin film region as the low resistance region 30, a portion of the electrode layer 19 is formed so as to enter into the spin barrier layer 18 in the film thickness direction, as shown in the drawing. More specifically, each layer is formed so that a portion of the second electrode layer 19B (peripheral region) enters in the peripheral region of the film surface of the spin barrier layer 18 in the film thickness direction after passing through the first electrode layer 19A in the film thickness direction. In so doing, the peripheral region of the spin barrier layer 18 becomes the low resistance region 30.

Figure 4B:
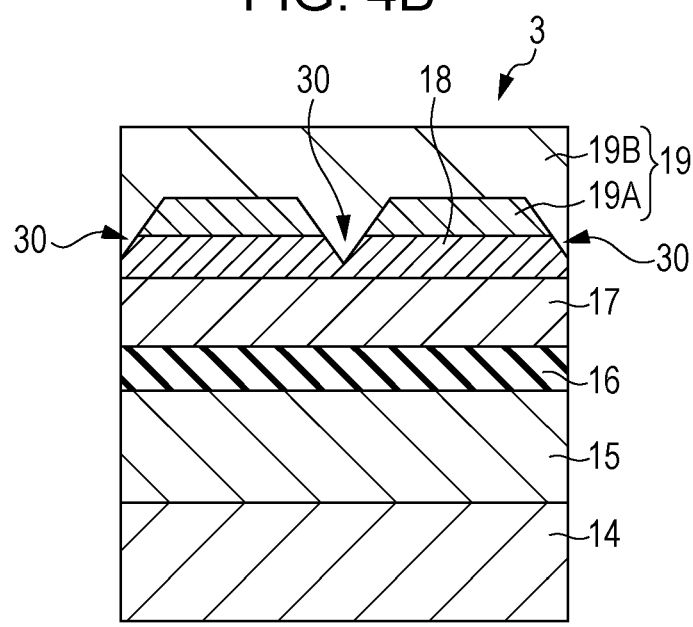

FIG. 4B shows the layer structure of the storage element 3 of the third embodiment.

In this case, although the spin barrier layer 18 is formed with the predetermined set film thickness value, the low resistance value region 30 in which a portion (for example, center region and peripheral region of film surface) of the spin barrier layer 18 is thinned more than the set film thickness value is formed.

In the thin film region as the low resistance region 30, a portion of the electrode layer 19 is formed so as to enter into the spin barrier layer 18 in the film thickness direction, as shown in the drawing. That is, each layer is formed so that a portion of the second electrode layer 19B (center region and peripheral region) enters in the center region and the peripheral region of the film surface of the spin barrier layer 18 in the film thickness direction after passing through the first electrode layer 19A in the film thickness direction. In so doing, the peripheral region and the center region of the spin barrier layer 18 becomes the low resistance region 30.

In the case of the above first, second and third embodiments, it is possible to reduce the resistance value of to the spin barrier layer 18 while obtaining an interface magnetization anisotropy effect due to the spin barrier layer 18 by a portion of the spin barrier layer 18 being set as the thinned low resistance region 30.

The first, second and third embodiments above are examples in which a portion of the spin barrier layer 18 is thinned. It is assumed that the position and number of the low resistance region 30 may be other than in the example.

Storage Element of Fourth and Fifth Embodiments

Figure 5A:
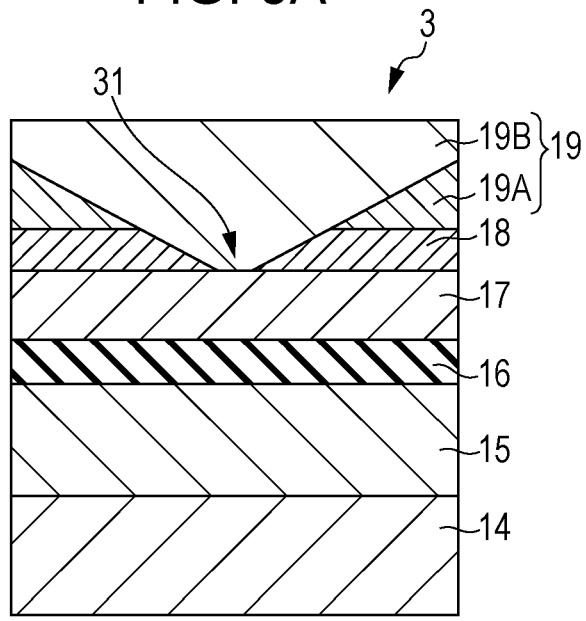
FIGS. 5A and 5B are explanatory diagrams of storage elements as fourth and fifth embodiment.

FIG. 5A shows the layer structure of the storage element 3 of the fourth embodiment.

In this case, although the spin barrier layer 18 is formed with a predetermined set film thickness value (for example, a film thickness value of 0.6 nm or more to 0.7 nm or less), a low resistance region 31 is formed in a portion (center region of the film surface) of the spin barrier layer 18.

In this case, the low resistance region 31 is a region in which the film thickness value of a portion (center region) of the spin barrier layer 18 is a lower value than the set film thickness value, and, more specifically, is a region in which the film thickness is zero.

As shown in the drawing, a portion of the electrode layer 19 contacts the storage layer 17 by passing through the spin barrier layer 18 in the film thickness direction. More specifically, a portion of the second electrode layer 19B (center region) contacts the storage layer 17 by passing through the center region of the film surface of the spin barrier layer 18 in the film thickness direction after passing through the first electrode layer 19A in the film thickness direction. That is, the low resistance region 31 is formed by the center region of the spin barrier layer 18 being removed.

Figure 5B:
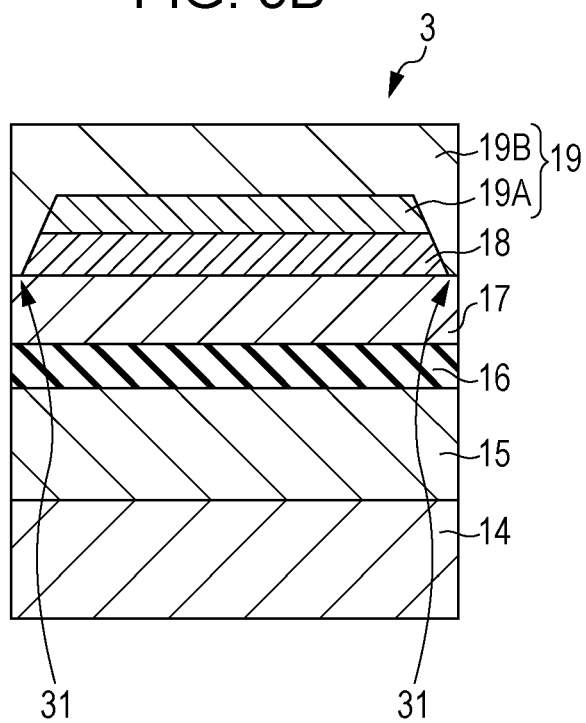

FIG. 5B shows the layer structure of the storage element 3 of the fifth embodiment.

In this case, although the spin barrier layer 18 is formed with a predetermined set film thickness value, the low resistance region 31 is formed in a portion (peripheral region of the film surface) in the spin barrier layer 18.

In this case, the low resistance region 31 is a region in which the film thickness value of a portion (peripheral region) of the spin barrier layer 18 is a lower value (film thickness value is zero) than the set film thickness value.

As shown in the drawing, a portion of the electrode layer 19 contacts the storage layer 17 by passing through the spin barrier layer 18 in the film thickness direction. More specifically, a portion of the second electrode layer 19B (center region) contacts the storage layer 17 by passing through the center region of the film surface of the spin barrier layer 18 in the film thickness direction after passing through the first electrode layer 19A in the film thickness direction. That is, the low resistance region 31 is formed by the center region of the spin barrier layer 18 being removed.

In the case of the above fourth and fifth embodiments, by setting the low resistance region 31 in which a portion of the spin barrier layer 18 is removed, it is possible reduce the resistance value of to the spin barrier layer 18 while obtaining an interface magnetization anisotropy effect due to the spin barrier layer 18 in a part that is not removed.

Although the example as in the above fourth and fifth embodiments sets the film thickness value of a portion of the spin barrier layer 18 as zero, It is assumed that the position and number of the low resistance region 31 may be other than in the example.

Storage Element of Sixth, Seventh, Eighth and Ninth Embodiments

Figure 6A:
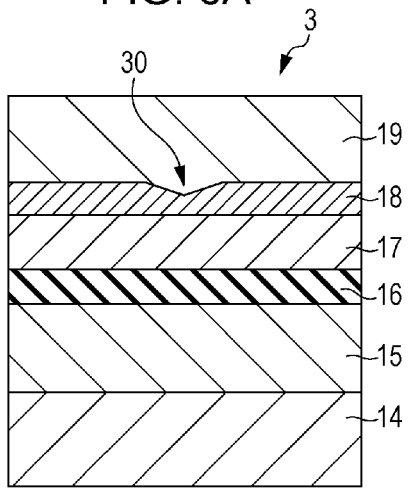
FIGS. 6A to 6D are explanatory diagrams of the storage element as sixth, seventh, eighth and ninth embodiment.

FIG. 6A shows the layer structure of the storage element 3 of the sixth embodiment. Although the example in which the low resistance region 30 of the thin film is formed in the peripheral region of the spin barrier layer 18 similarly to the second embodiment described above is given, one electrode layer 19 with the same material is given in the example without distinguishing between the electrode layers 19A and 19B.

Figure 6B:
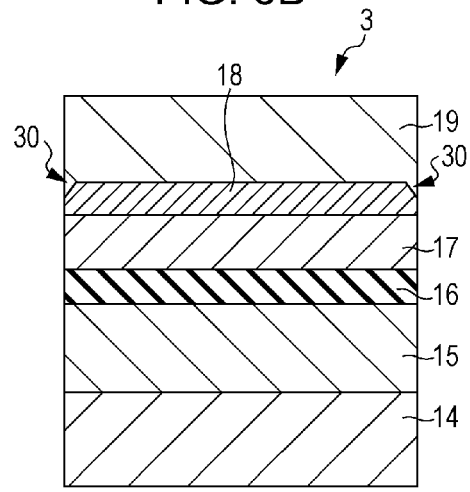

FIG. 6B shows the layer structure of the storage element 3 of the seventh embodiment. Although the example in which the low resistance region 30 of the thin film is formed in the center region of the spin barrier layer 18 similarly to the first embodiment described above is given, one electrode layer 19 with the same material is given in the example without distinguishing between the electrode layers 19A and 19B.

Figure 6C:
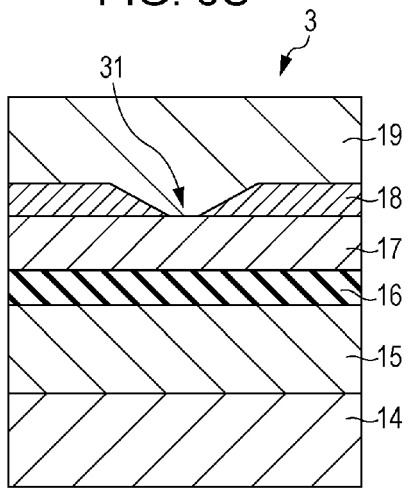

FIG. 6C shows the layer structure of the storage element 3 of the eighth embodiment. Although the example in which the low resistance region 31 with a film thickness zero is formed in the center region of the spin barrier layer 18 similarly to the fourth embodiment described above is given, one electrode layer 19 with the same material is given in the example without distinguishing between the electrode layers 19A and 19B.

Figure 6D:
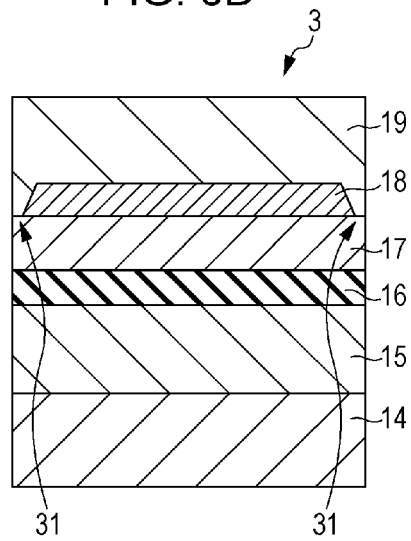

FIG. 6D shows the layer structure of the storage element 3 of the ninth embodiment. Although the example in which the low resistance region 31 with a film thickness zero is formed in the peripheral region of the spin barrier layer 18 similarly to the first embodiment described above is given, one electrode layer 19 with the same material is given in the example without distinguishing between the electrode layers 19A and 19B.

As in the sixth to ninth embodiments, it is not necessary to provide the first electrode layer 19A and the second electrode layer 19B made from different materials in the electrode layer 19.

In other words, in the case of a configuration in which the low resistance regions 30 and 31 in which a portion of the spin barrier layer 18 has a film thickness value lower than the set film thickness value are provided, the first electrode layer 19A and the second electrode layer 19B may be formed with different materials as in the first to fifth embodiments, or may be formed as one electrode layer 19 with the same material as in the sixth to ninth embodiments.

In the case of forming the first electrode layer 19A and the second electrode layer 19B as in the first to fifth embodiments, conductivity is not necessary in the first electrode layer 19A, and either a conductor or an insulator may be used.

Storage Element of Tenth, Eleventh and Twelfth Embodiments

The storage element of the tenth, eleventh, and twelfth embodiments is an example in which the electrical resistance of a portion of the spin barrier layer 18 is lowered by a portion of the spin barrier layer 18 that is an oxide layer, such as MgO, being reduced. Here, a portion of the spin barrier layer 18 being reduced may be considered thinning of the effective film thickness at a portion of the spin barrier layer 18.

FIG. 7A shows the layer structure of the storage element 3 of the tenth embodiment.

The spin barrier layer 18 is formed with a predetermined set film thickness value (for example, a film thickness value of 0.6 nm or more to 0.7 nm or less). The low resistance region 32 is formed at a portion (center portion of the film surface) in the spin barrier layer 18.

The low resistance region 32 is a region in which the resistance value is lowered by an oxide in a portion (center region) of the spin barrier layer 18 being reduced.

As shown in the drawing, a portion (center region) of the second electrode layer 19B contacts the spin barrier layer 18 by passing through the first electrode layer 19A in the film thickness direction.

In this case, a material with a low reactivity to oxide is used in the first electrode layer 19A, and a material with a high reactivity to oxide is used in the second electrode layer 19B. By using such materials, it is possible to obtain a low resistance region 32 by a portion of the spin barrier layer 18 being transformed (reduced) through reaction of the material of the second electrode layer 19B after thermal treatment and the oxide of the spin barrier layer 18.

An oxide material, such as MgO, $Al_2O_3$, and $SiO_2$ is used in the spin barrier layer 18 as described above. The difference in reactivities to such an oxide material is primarily due to the difference in the ionization tendency of the material. A material with a low ionization tendency, such as Ru, Cu, W, Pt, Pd, Cr, TiN, TaN, TiC and ITO, or a stable oxide or nitride, such as $Si_3N_4$, $TiO_2$, MgO, and $Al_2O_3$ is used in the first electrode layer 19A. Meanwhile, a material with a strong ionization tendency, such as Ta, Nb, Zr, Hf, and Y, may be used in the second electrode layer 19B. In so doing, it is possible for the oxide in the center portion that contacts the second electrode layer 19B to be reduced in the spin barrier layer 18 as shown in FIG. 7A, thereby forming the low resistance region 32.

FIG. 7B shows the layer structure of the storage element 3 of the eleventh embodiment.

In this case, although the spin barrier layer 18 is formed with a predetermined set film thickness value, the low resistance region 32 in which the resistance value is lowered by the oxide in a portion (peripheral region of the film surface) of the spin barrier layer 18 being reduced is formed.

As shown in the drawing, a portion (peripheral region) of the second electrode layer 19B contacts the peripheral region of the film surface of the spin barrier layer 18 after passing through the first electrode layer 19A in the film thickness direction. The low resistance region 32 is formed by the first and second electrode layers 19A and 19B being the above-described materials.

FIG. 7C shows the layer structure of the storage element 3 of the twelfth embodiment.

In this case, although the spin barrier layer 18 is formed with a predetermined set film thickness value, the low resistance region 32 in which the resistance value is reduced by the oxide in a portion (center region and peripheral region of the film surface) of the spin barrier layer 18 being reduced is formed.

As shown in the drawing, a portion (central region and peripheral region) of the second electrode layer 19B contacts the central region and the peripheral region of the film surface of the spin barrier layer 18 after passing through the first electrode layer 19A in the film thickness direction. The low resistance region 32 is formed by the first and second electrode layers 19A and 19B being the above-described materials.

In the case of the above tenth, eleventh and twelfth embodiments, it is possible to reduce the resistance value of the spin barrier layer 18 while obtaining an interface magnetization anisotropy effect due to the spin barrier layer 18 by a portion of the oxide of the spin barrier layer 18 being reduced being set as the thinned low resistance region 32.

Although the above tenth, eleventh and twelfth embodiments show a layer structure in which a portion of the second electrode layer 19B contacts a portion of the spin barrier layer 18, if a region is formed in which the second electrode layer 19B approaches the spin barrier layer 18 by the first electrode layer 19A being thinned, it is possible to similarly form the low resistance region 32 through the diffusion of atoms in this part even if the second electrode layer 19B and the spin barrier layer 18 are not in direct contact. That is, a low resistance region 32 may be formed by oxide in a partial region in the spin barrier layer 18 being reduced by a portion of the second electrode layer 19B entering (without passing through) the first electrode layer 19A in the film thickness direction and approaching the spin barrier layer 18.

Since the current flowing in the storage element 3 passes through a portion (low resistance region 32) of the spin barrier layer 18 from the second electrode layer 19B and flows to the storage layer 17, conductivity is not necessary in the first electrode layer 19A, and either a conductor or an insulator may be used.

Although to this point examples of forming the low resistance regions 30 and 31 by thinning or removing a portion of the spin barrier layer 18 were described as the first to ninth embodiments, and examples of forming the low resistance region 32 by reducing a portion of the spin barrier layer 18 were described as the tenth to twelfth embodiments, these may be combined and applied.

For example, in the case of forming the low resistance regions 30 and 31 by thinning or removing a portion of the spin barrier layer 18 as in FIGS. 3A, 4A, 4B, 5A, and 5B, if a material with low reactivity to oxide is used in the first electrode layer 19A, and a material with high reactivity to oxide is used in the second electrode layer 19B, it is possible to form the low resistance region by obtaining the combined action of a lowered resistance due to thinning or removal and action of lowered resistance due to reduction.

3. Manufacturing Method of Embodiment

Thirteen to Seventeenth Embodiments

Next, the method of manufacturing a storage element 3 with a layered structure as above will be described as the thirteenth to eighteenth embodiments.

Although FIGS. 8A to 14C are used in the description, the depiction of the underlayer 14 is not made in the drawings.

Method of Manufacturing of Thirteenth Embodiment

FIGS. 8A to 8F show the procedure of the method of manufacturing of the thirteenth embodiments.

FIG. 8A shows a state in which the shape of the storage element 3 is formed after the underlayer 14 (not shown), magnetization fixing layer 15, tunnel barrier layer 16, storage layer 17, and spin barrier layer 18 are stacked in order, and the first electrode layer 19A is further layered (film formation). FIGS. 8A to 14C show cross-sectionals of the storage element 3, and the storage element 3 has, for example, a circular cylindrical shape. Such storage elements 3 are arrayed in large numbers as a storage device. In the drawing, the storage element 3 in the course of manufacturing is given the reference "3P".

After the film is formed up to the state in FIG. 8A, as shown in FIG. 8B, an insulating material 20 for burying is filled in the space between storage elements 3P. The insulating material is formed so that the storage element 3P is sufficiently buried by a film forming method such as a sputtering method.

Next, as shown in FIG. 8C, step differences are removed by polishing such that the first electrode layer 19A is exposed.

Next, as shown in FIG. 8D, the device is irradiated with an ion beam for etching from an oblique direction. It is desirable that the etching method use a method that easily etches the first electrode layer 19A and does not easily etch the insulating material 20. Therefore, although reactive ion etching with material selectivity may be used, if the first electrode layer 19A is a material with a high etching rate, such as Cu and Al, a physical etching method, such as ion milling, may be used.

Etching of the first electrode layer 19A is performed while rotating the substrate. In this way, the peripheral region of the first electrode layer 19A is not easily etched with the shielding effect of the insulating material 20 with a low etching rate, and the center region becomes easily etched. Therefore, as shown in the drawings, the center region is worked to a hollowed shape.

The etching may be performed until the center region of the first electrode layer 19A is removed, or until a portion of the spin barrier layer 18 is hollowed, or the first electrode layer 19A remains as a thin film. Etching may performed until a portion of the spin barrier layer 18 is removed.

For example, in the case of forming the storage element 3 of the above-described first embodiment (FIG. 3A), the center portion of the spin barrier layer 18 is etched until hollow.

In the case of forming the storage element 3 of the above-described fourth embodiment (FIG. 5A), the center region of the spin barrier layer 18 is etched until removed.

In the case of forming the storage element 3 of the above-described tenth embodiment (FIG. 7A), the center portion of the first electrode layer 19A is etched until removed, or to the extent that a thin film remains.

Next, as shown in FIG. 8E, the material of the second electrode layer 19B is stacked so as to bury the first electrode layer 19A which is hollowed by etching.

The surface is polished and made flat as shown in FIG. 8F. In so doing, the storage element 3 (for example, the layer structure in FIG. 3A) with the layer structure up to the second electrode layer 19B is formed.

Thereafter, the storage device is prepared by additional work or forming wirings, as necessary. Through the above, the storage element 3 as in FIGS. 3A, 5A and 7A may be manufactured.

In the above steps, the angle of incidence of the ion beam when the first electrode layer 19A is worked is dependent on the diameter of the storage element 3 (3P) and the thickness of the first electrode layer 19A. Manufacturing becomes easier as the thickness of the first electrode layer 19A increases, the diameter of the storage element 3 decreases and the angle of incidence of the ion beam approaches perpendicular to the film surface.

However, the working time increases due to etching when the thickness of the first electrode layer 19A thickens, and controlling the etching state of the center region of the element becomes difficult.

As a method of solving this, after forming an electrode protecting layer on the first electrode layer 19A, thereby achieving the state in FIG. 8C, a method in which the electrode protecting layer is removed through selective etching, and working is performed exposing the first electrode layer thereunder is effective.

A metal film, such as Ti, Ta and W, may be used as the electrode protecting layer, and TiN, $Si_3N_4$, C or the like may also be used, and the hard mask for element etching may be used as an electrode protecting film.

Below, a method using a hard mask will be described as the fourteenth embodiment.

Method of Manufacturing of Fourteenth Embodiment

The method of manufacturing of the fourteenth embodiment in which the center region of the first electrode layer 19A is thinned using the hard mask 21 will be described using FIGS. 9A to 10C.

FIG. 9A shows a state in which the hard mask 21 is formed after the underlayer 14 (not shown), magnetization fixing layer 15, tunnel barrier layer 16, storage layer 17, and spin barrier layer 18 are stacked in order, and the first electrode layer 19A is further layered (film formation).

Thereafter, as shown in FIG. 9B, a photomask 22 for forming the shape of the storage element 3 is prepared using photo processing.

Next, the hard mask 21 is selectively etched as in FIG. 9C, thereby forming a hard mask pattern. In so doing, a circular region of the hard mask 21 that is the storage element 3 remains.

Then, the photomask 22 is removed, and the shape of the storage as in FIG. 9D is formed according to the hard mask pattern.

Next, the part etched according to the hard mask pattern is filled with the insulating material 20, and planarized as in FIG. 9E.

Then, the hard mask 21 is removed by selective etching as in FIG. 9F.

In the state in FIG. 9F, it is possible to form the first electrode layer 19A at a deeper position compared to a method in which the hard mask described in FIGS. 8A to 8F is not used. Accordingly, it is possible for the angle of the ion beam that performs the etching to approach perpendicular.

Etching is performed using ion beam irradiation from obliquely above as in FIGS. 10A to 10C, and the first electrode layer 19 is worked into a shape in which the center region is hollowed. Etching may be performed until the center region of the first electrode layer 19A is removed or until a portion of the spin barrier layer 18 is hollowed, or until a portion is removed, or may be performed to an extent at which the first electrode layer 19A remains as a thin film.

Thereafter, as shown in FIG. 10B, the material of the second electrode layer 19B is stacked so as to bury the first electrode layer 19A which is hollowed by etching.

The surface is polished and made flat as shown in FIG. 10C. In so doing, the storage element 3 (for example, the layer structure in FIG. 3A or the like) with the layer structure up to the second electrode layer 19B is formed.

Thereafter, the storage device is prepared by additional work or forming wirings, as necessary.

Through the above, the storage element 3 as in FIGS. 3A, 5A and 7A may be manufactured.

In the method of manufacturing of the thirteenth and fourteenth embodiments, if the materials of the first electrode layer 19A and the second electrode layer 19B are the same, it is possible to manufacture the storage element 3 as in FIGS. 6A and 6C.

Method of Manufacturing of Fifteenth Embodiment

The method of manufacturing the storage element 3 as in FIGS. 4A, 5B and 7B will be described as the fifteenth embodiment.

Since the steps shown in FIGS. 9A to 9F as the fourteenth embodiment are the same, description will not be made.

After entering the state in FIG. 9F, etching is performed by ion beam irradiation as in FIG. 11A.

In this case, the angle of incidence of the ion beam is set to an angle closer to parallel to the substrate surface than the case of FIG. 10A. Thereby, since the center region of the first electrode layer 19A is shadowed, etching is difficult, and the peripheral region is more greatly etched. Thereby, the peripheral region of the first electrode is worked to be thin.

The etching may be performed until the peripheral region of the first electrode layer 19A is removed, or until a portion of the spin barrier layer 18 is hollowed, or the first electrode layer 19A remains as a thin film. Etching may performed until a portion of the spin barrier layer 18 is removed. For example, in the case of forming the storage element 3 of the above-described second embodiment (FIG. 4A), the peripheral portion of the spin barrier layer 18 is etched until hollow.

In the case of forming the storage element 3 of the above-described fifth embodiment (FIG. 5B), the peripheral portion of the spin barrier layer 18 is etched until removed.

In the case of forming the storage element 3 of the above-described eleventh embodiment (FIG. 7B), the peripheral portion of the first electrode layer 19A is etched until removed, or to the extent that a thin film remains.

Thereafter, as shown in FIG. 11B, the material of the second electrode layer 19B is stacked so as to bury the first electrode layer 19A which is hollowed by etching.

The surface is polished and made flat as shown in FIG. 11C. In so doing, the storage element 3 (for example, the layer structure in FIG. 4A) with the layer structure up to the second electrode layer 19B is formed.

Thereafter, the storage device is prepared by additional work or forming wirings, as necessary.

Through the above, the storage element 3 as in FIGS. 4A, 5B and 7B may be manufactured. In the method of manufacturing of the fifteenth embodiment, if the materials of the first electrode layer 19A and the second electrode layer 19B are the same, it is possible to manufacture the storage element 3 as in FIGS. 6B and 6D.

Since the etching angle is changed in progress in the step in FIG. 11A, etching both the peripheral region and the center region to be hollowed is also possible. Accordingly, it is possible to manufacture the storage element 3 as in FIGS. 4B and 7C.

Method of Manufacturing of Sixteenth Embodiment

Next, the method of manufacturing of the sixteenth embodiment in which the spin barrier layer 18 is formed by etching after etching of the first electrode layer 19A will be described with FIG. 12.

Since the steps shown in FIGS. 9A to 9F as the fourteenth embodiment are the same, description will not be made.

Figure 12A:
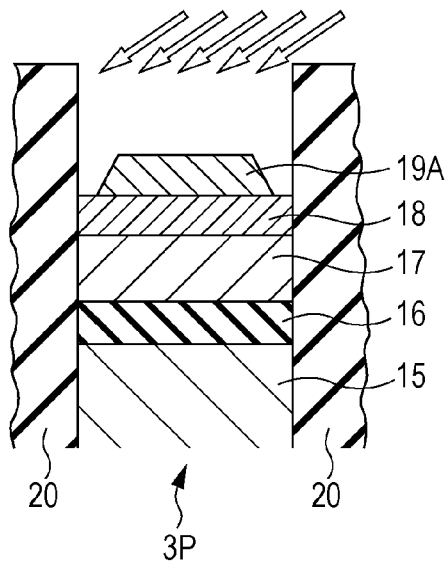
FIGS. 12A to 12D are explanatory diagrams of a method of manufacturing as a sixteenth embodiment.

After entering the state in FIG. 9F, etching is performed by ion beam irradiation from an oblique direction as in FIG. 12A.

At this time, if the etching method, type and conditions of gas, and the like are selected so as to selectively etch the material of the first electrode layer 19A, it is possible to remove the end portion of the first electrode layer 19A without excessively removing the spin barrier layer 18, and thereby possible for the spin barrier layer 18 to be exposed.

Figure 12B:
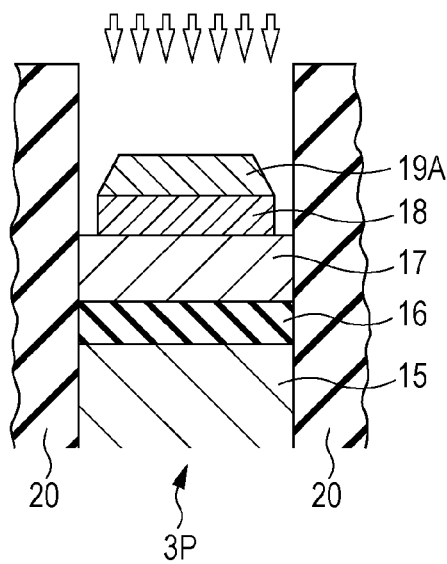

Next, etching is performed by ion beam irradiation from above as in FIG. 12B. In this case, the etching rate of the first electrode layer 19A is low, and etching is performed under conditions of a large etching rate of the spin barrier layer 18, the first electrode layer 19A becomes a mask, and the end portion of the spin barrier layer 18 is etched.

Figure 12C:
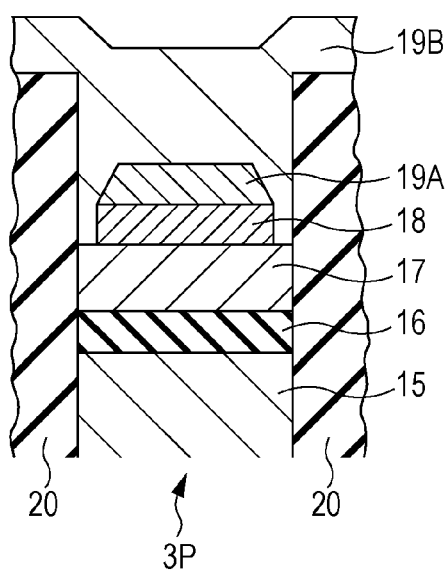
Figure 12D:
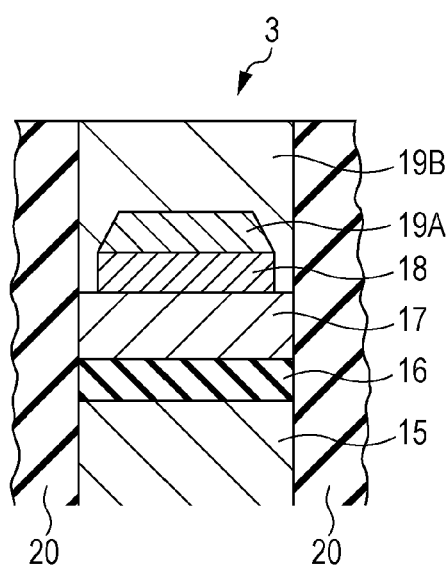

Next, the material of the second electrode layer 19B is embedded as shown in FIG. 12C, and the second electrode layer 19B is connected by the peripheral region to the storage layer 17 either directly or via the thin spin barrier layer 18. Thereafter surface is polished and made flat as in FIG. 12D.

Thereafter, the storage device is prepared by additional work or forming wirings, as necessary.

Through the above, the storage element 3 as in FIGS. 4A, 5B and 7B may be manufactured. If the materials of the first electrode layer 19A and the second electrode layer 19B are the same, it is possible to manufacture the storage element 3 as in FIGS. 6B and 6D.

Although the sixteenth embodiment has been described with an example of etching the peripheral region of the spin barrier layer 18, if the etching angle in FIG. 12A is appropriate, it is possible for etching of the center region of the spin barrier layer 18 to be performed.

Method of Manufacturing of Seventeenth Embodiment

The above is a method of manufacturing in which etching from an oblique direction is necessary; however, next, a method of manufacturing of the seventeenth embodiment in which etching from an oblique direction is not necessary with be described with FIGS. 13A to 14C.

Since the steps shown in FIGS. 9A to 9F as the fourteenth embodiment are the same, description will not be made. However, the depth of the hollow in FIG. 9F after the hard mask is removed may be shallower than in the case of the fourteenth embodiment.

Figure 13A:
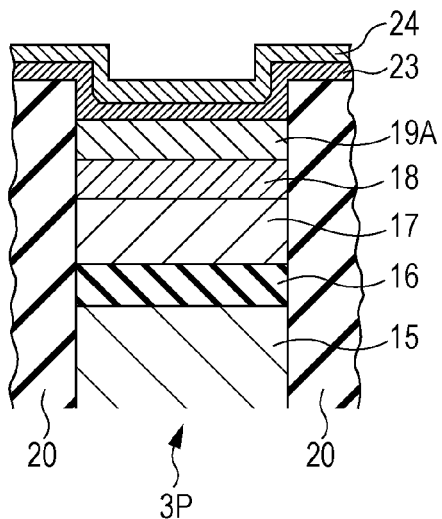
FIGS. 13A to 13D are explanatory diagrams of a method of manufacturing as a seventeenth embodiment.

After entering the state in FIG. 9F, a first auxiliary mask layer 23 and a second auxiliary mask layer 24 are formed as in FIG. 13A. It is preferable that the two auxiliary mask layers 23 and 24 be very different with etching rates, and it is preferable that the etching rate of the first auxiliary mask layer 23 be higher than the etching rate of the second auxiliary mask layer 24. The materials of the first and second auxiliary mask layers 23 and 24 may be a metal, a ceramic or an organic substance.

Figure 13B:
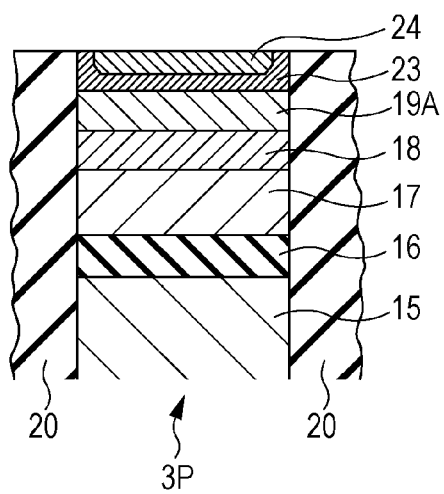
Figure 13C:
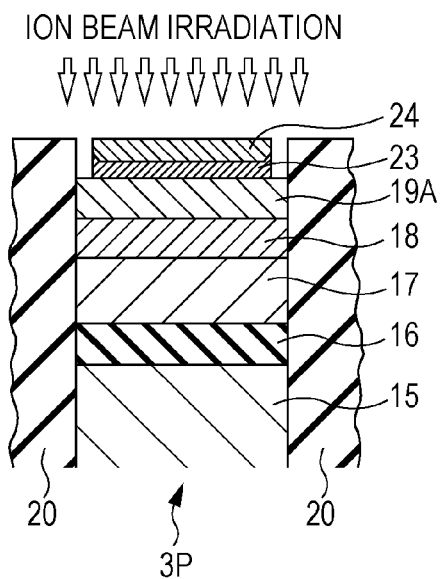

Next, the surface is polished as in FIG. 13B. Polishing may be performed until the insulating material 20 is exposed; however, at minimum, a portion of the first auxiliary mask layer 23 may be exposed.

The second auxiliary mask layer 24 maybe the same height as the insulating material 20 in a state in which the polishing is finished, or the second auxiliary mask layer 24 may be hollowed.

Next, etching is performed on the first auxiliary mask layer 23 as in FIGS. 13A to 13D.

Here, etching may be performed under conditions in which the etching rate of the first auxiliary mask layer 23 is greater than the etching rate of the second auxiliary mask layer 24.

The etching method may be ion milling, may be reactive ion etching, or may be a chemical method. In addition, these may be combined. It is preferable etching that the angle of ion beam irradiation for etching be close to perpendicular to the film surface such that the etching particles sufficiently enter the fine grooves.

Figure 13D:
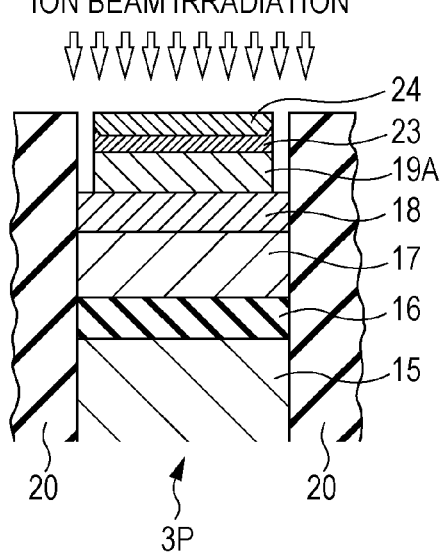

Ion beam irradiation is continued as in FIG. 13D, and the etching of the first electrode layer 19A is continuously performed. If it is possible for the first electrode layer 19A and the first auxiliary mask layer 23 to be the same material or be etched under the same etching conditions, the step in FIG. 13C and the step in FIG. 13D may be performed at the same time.

Figure 14A:
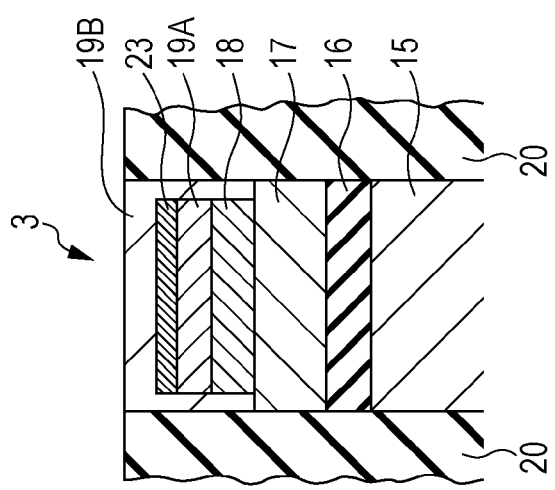
FIGS. 14A to 14C are explanatory diagrams of a method of manufacturing as the seventeenth embodiment.

Next, etching of the spin barrier layer 18 is performed as in FIG. 14A.

The etching conditions may be the same for the first auxiliary mask layer 23 and the first electrode layer 19A, or the conditions may be that the etching rate of the spin barrier layer 18 is higher. When the spin barrier layer 18 is etched, the first auxiliary mask layer 23, the second auxiliary mask layer 24 and the first electrode layer 19A may be etched. In other words, a thickness at which the spin barrier layer 18 outside the peripheral area sufficiently functions may remain.

In FIG. 14A, although a state in which only the second auxiliary mask layer 24 only is removed along with the peripheral region of the spin barrier layer 18 is shown, the first auxiliary mask layer 23 or even the first electrode layer 19A may be further removed. Alternatively, the first and second auxiliary mask layers 23 and 24 may also remain.

The peripheral region of the spin barrier layer 18 may be etched until removed (in the case of forming the storage element 3 in FIG. 5B), or may remain in a thin film state (in the case of forming the storage element 3 in FIG. 4A). Etching of the spin barrier layer 18 may be not performed according to the material of the second electrode layer 19B (in the case of forming the low resistance region 32 by reduction as in FIG. 7B).

Figure 14B:
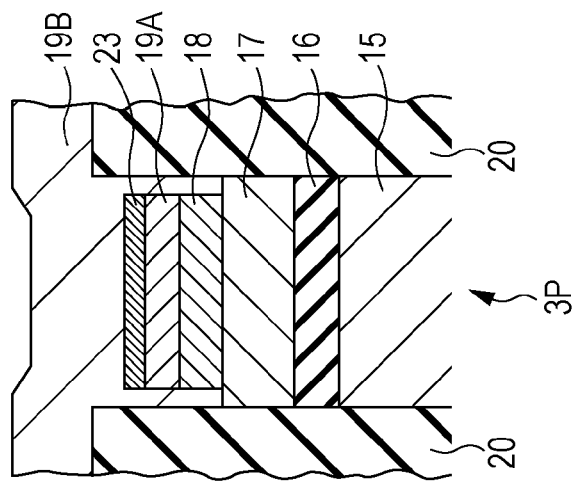
Figure 14C:
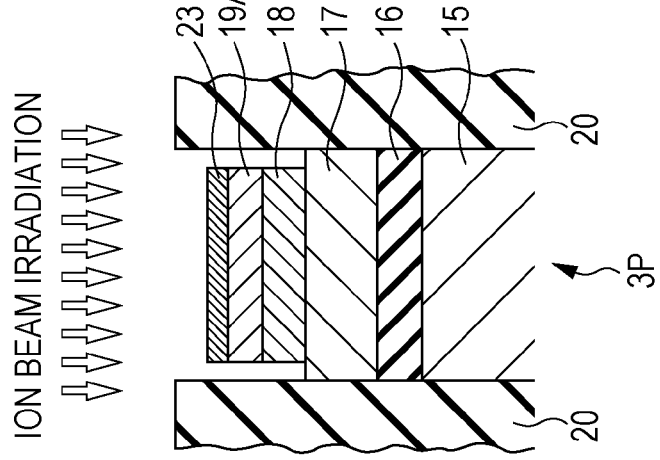

Next, the second electrode layer 19B is formed as in FIG. 14B. Although the second electrode layer 19B may be formed with a sputtering method or the like, a chemical vapor deposition method or the like is suitable in order to perform sufficient filling in the fine grooves. Thereafter surface is polished and made flat as in FIG. 14C. Thereafter, the storage device is prepared by additional work or forming wirings, as necessary.

Through the above, the storage element 3 as in FIGS. 4A, 5B and 7B may be manufactured without performing etching from an oblique angle.

4. Testing

Below, testing results for the storage element 3 of the embodiment will be described.

In testing, sample 1 as a comparative example, sample 2 corresponding to the tenth embodiment, and sample 3 corresponding to the eleventh embodiment were used. The layer structures of samples 1, 2 and 3 are shown in FIGS. 15A, 15B and 15C.

The layer structures common to samples 1, 2 and 3 are as follows. The value in brackets ( ) is the film thickness.

Underlayer 14: Ta (5 nm)

Magnetization fixing layer 15: a stacked ferri-pinned structure of Ru (3 nm)/CoPt (2 nm)/Ru (0.7 nm)/FeCoB (1 nm)

Tunnel barrier layer 16: MgO (0.7 nm)

Storage layer 17: 3 layer structure of FeCoB (1.2 nm)/Ta (0.2 nm)/FeCoB (1.2 nm)

Spin barrier layer 18: MgO (0.6 nm)

First electrode layer 19A: Ru (3 nm)

The element shape of each sample was formed in a disk shape with a diameter of 50 nm.

In the method of forming the element, a film was used in which a 10 nm TiN film is formed as the hard mask in the above layer structure. Sample 1 in which an upper wiring was formed as is after an element is formed of TiN by ion milling as the hard mask, and $SiO_2$ is embedded and planarized as an insulating material 20 was used as a comparative example. The second electrode layer 19B was made from TiN.

In the samples 2 and 3 corresponding to the embodiments, the TiN was removed by reactive ion etching (RIE) after embedding and planarizing with the insulating material 20, and the Ru of the element surface (first electrode layer 19A) was exposed.

Etching was further performed until a portion of the Ru of the first electrode layer 19A was removed by ion milling from angles of 30 degrees and 10 degrees from the film surface. The 30 degree etching angle is the condition in which the center region of the first electrode layer 19A is thinned, and 10 degrees is the condition in which the peripheral region of the first electrode layer 19A is thinned. Sample 2 was formed at 30 degrees, and sample 3 was formed at 10 degrees.

A hollow formed by etching is buried by Ta and planarized, thereby forming an upper wiring. The second electrode layer 19B is formed from Ta.

FIG. 16C shows the resistance values, coercive force, reversal voltage and magnetic resistance ratio (MR ratio) for the storage elements of samples 1, 2 and 3.

In the case of samples 2 and 3 that correspond to the embodiments, since the increase in resistance due to the spin barrier layer 18 is small, the resistance value is low compared to the comparative example (sample 1).

Since there is no remarkable difference in coercive force in the samples 1, 2 and 3, the coercive force enhancing effect is maintained in the embodiments due to the spin barrier layer 18.

The element resistance in any of the storage elements of samples 2 and 3 is lowered compared to the comparative example (sample 1), and the reversal current becomes low.

The MR ratio for samples 2 and 3 also increase with respect to sample 1.

FIGS. 16A and 16B show changes in the coercive force Hc and the surface resistance RA with respect to the spin barrier layer thickness for sample 1 (comparative example) and sample 3 (embodiment).

As in FIG. 16A, in a case in which the thickness of the spin barrier layer is thin in the comparative example, the coercive force Hc is low, and in a case where thick, the surface resistance RA is high. That is, it is difficult to find optimal conditions of an optimal spin barrier layer thickness in which the coercive force Hc is high and the surface resistance RA is low.

On the other hand, in the sample 3 of the embodiment, the surface resistance RA is not very dependent on the spin barrier layer thickness, as shown in FIG. 16B. Therefore, the spin barrier layer thickness with a sufficiently large coercive force Hc is easily set. More specifically, the range of 0.6 nm to 0.7 nm is suitable for the spin barrier layer thickness.

Next, assuming the tenth, eleventh and twelfth embodiments, that is, assuming a configuration in which the electrical resistance of a portion of the spin barrier layer 18 is lowered by a portion of the spin barrier layer 18 being reduced, the influence on the element resistance of the spin barrier layer in a case various elements or compound materials are arranged on the spin barrier layer was examined.

Figure 17:
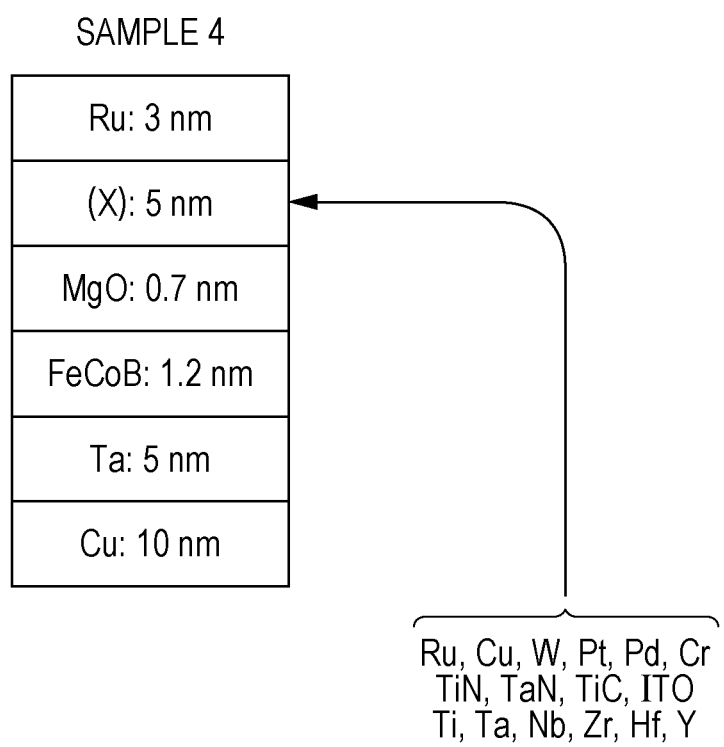
FIG. 17 is an explanatory diagram of the structure of a working sample.

As shown in FIG. 17, a plurality of types of sample 4 with layer structure of Cu (10 nm)/Ta (5 nm)/FeCoB (1.2 nm)/

MgO (0.7 nm)/x(5 nm)/Ru (3 nm) was used. The plurality of types of sample 4 included various elements or compound materials depicted in the drawing as the X layer. The MgO layer corresponds to the spin barrier layer 18.

FIG. 18 shows the resistance of the tunnel barrier (RA) obtained by a 12 terminal CIPT method and the perpendicular coercive force (Hc) obtained by magnetization measurement for each of the plurality of types of sample 4.

The material in which the surface resistance RA is high and the perpendicular coercive force is also high has little reaction with the MgO layer (tunnel barrier layer), and has little deterioration of the tunnel barrier layer. Therefore, the material is suitable to the first electrode layer 19A of the embodiment.

Meanwhile, since a material in which the surface resistance RA is low, and the perpendicular coercive force is low, or is in-plane magnetized reacts with the MgO layer, and the effective film thickness of the MgO is thinned, the material is suitable to the second electrode layer 19B.

From FIG. 18, materials suitable to the first electrode layer 19A are Ru, Cu, W, Pt, Pd, Cr, TiN, TaN, TiC, and ITO, and materials suitable to the second electrode layer 19B are Ti, Ta, Nb, Zr, Hf, and Y.

Although insulators, since stable oxides or nitrides, such as $Si_3N_4$, $TiO_2$, MgO, and $Al_2O_3$ do not deteriorate a MgO tunnel barrier layer, it is possible to use stable oxides or nitrides as the first electrode layer 19A.

5. Summary

Although the embodiments have been described above, the following effects may be obtained according to the storage element, storage device, and method of manufacturing the storage element of the embodiments.

The storage element 3 of the first to twelfth embodiments includes the storage layer 17 including magnetization perpendicular to the film surface, in which the direction of the magnetization is changed corresponding to the information, and the magnetization fixing layer 15 having magnetization perpendicular to the film surface that becomes a reference for information stored in the storage layer 17. The storage elements also include a tunnel barrier layer 16 made from an oxide provided between the storage layer 17 and the magnetization fixing layer 15, and a spin barrier layer 18 made from an oxide provided contacting a surface of the opposite side of the storage layer 17 to the surface contacting the tunnel barrier layer 16. In other words, the structure is a layer structure in which oxide layers (tunnel barrier layer 16 and spin barrier layer 18) contact both surface sides of the storage layer 17. Information is stored in the storage layer 17 by changing the direction of magnetization of the storage layer 17 by a current flowing in the stacking direction of such a layer structure. A low resistance region (30, 31, 32) is formed in a portion of the spin barrier layer 18 formed with a predetermined set film thickness value.

In other words, a spin barrier layer 18 is formed with a sufficient thickness of a given extent as the set film thickness value, and the resistance value of the spin barrier layer 18 is lowered by forming a low resistance region (30, 31 and 32) in a portion thereof, while obtaining interface magnetization anisotropy energy. Accordingly, it is possible to realize a non-volatile memory with excellent coercive characteristics, and able to operate at a low voltage and low current.

For the storage element 3 of the embodiment, because the storage layer 17 is a perpendicular magnetization film, it is possible for the amount of write current that is necessary for the direction of the magnetization M17 of the storage layer 17 to be reversed to be decreased.

Because it is possible to secure sufficient thermal stability that is the information holding ability, it is possible to configure a storage element 3 with excellent characteristic balance.

In so doing, it is possible to eliminate operating errors, and obtain sufficient operating margin in the storage element 3, and possible for the storage element 3 to be stably operated.

Accordingly, it is possible to realize a memory that operates stably and is highly reliable.

For the storage element 3 of the first to ninth embodiments, a low resistance region 30 (or 31) is formed by setting the film thickness value of a portion of the spin barrier layer 18 to a value (including a film thickness zero) lower than the set film thickness value. That is, by a portion of the spin barrier layer 18 having a film thickness thinner than the set film thickness value or a film thickness zero (that is, removed), it is possible to physically realize the low resistance regions 30 and 31.

The storage element of the first to third, sixth and seventh embodiments is formed such that the film thickness value of the entering part is a value smaller than the set film thickness value by a portion of the electrode layer 19 being formed so as to enter with respect to the spin barrier layer 18 in the film thickness direction. In so doing, it is possible to form a portion of the spin barrier layer as thin film low resistance region as seen from the electrode layer 19.

The storage element 3 of the first to third embodiments is formed such that a portion of the second electrode layer 19B enters with respect to the spin barrier layer 18 in the film thickness direction after passing through the first electrode layer 19A in the film thickness direction. In this case, it is possible to easily realize a layer structure in which the electrode layer 19 enters the spin barrier layer 18 with a method in which a portion of the first electrode layer 19A is removed by etching, and the second electrode layer is further filled after a portion of the spin barrier layer 18 is thinned.

By the storage elements 3 of the fourth, fifth, eighth, and ninth embodiments being formed such that a portion of the electrode layer 19 contacts the storage layer 17 by passing through the spin barrier layer 18 in the film thickness direction, a low resistance region 31 is created in which the film thickness value of the passing portion is lower than the set film thickness value.

That is, by forming a portion of the electrode layer 19 to contact the storage layer by passing through the spin barrier layer 18, it is possible to remove a portion of the spin barrier layer 18 and to make the resistance due to the spin barrier layer 18 extremely small.

The storage element 3 of the fourth and fifth embodiments is formed such that a portion of the second electrode layer 19B contacts the storage layer 17 by passing through the spin barrier layer 18 in the film thickness direction after passing through the first electrode layer 19A in the film thickness direction. In this case, it is possible to easily realize a layer structure in which the electrode layer 19 contact the storage layer 17 by passing through the spin barrier layer 18 with a method in which a portion of the first electrode layer 19A is removed by etching, and the second electrode layer 19B is further filled after a portion of the spin barrier layer 18 is removed.

In the storage element 3 of the first to ninth embodiments, a low resistance region 30 (or 31) is created by spin barrier layer 18 being formed so that the film thickness value is a value lower than the set film thickness value in one or both of a center region and a peripheral region of the film surface.

The thinning of center region or the peripheral region of the film surface is easily realized through etching or the like from, for example, an oblique direction, and is suitable to the manufacturing of the storage element 3 including the low resistance regions 30 and 31.

For the storage element 3 of the tenth to twelfth embodiment, the low resistance region 32 is formed by an oxide in a partial region of the spin barrier layer 18 being reduced. It is possible to generate a region with a low resistance value by a portion of the oxide that configures the spin barrier layer 18 being reduced, and possible to form the low resistance region 32 with a method not using physical thinning.

For the storage element 3 of the tenth to twelfth embodiments, the second electrode layer 19B is made from a material with a higher reactivity to oxide than the first electrode layer 19A, and the low resistance region 32 is formed by the oxide in a partial region in the spin barrier layer 18 being reduced by a portion of the second electrode layer 19B contacting or approaching the spin barrier layer 18 by passing through or entering the first electrode layer 19A in the film thickness direction.

If the second electrode layer 19B is made from a material with a high reactivity to oxide, such as a material with a high ionization tendency, and contacts of approaches a portion of the spin barrier layer 18, it is possible to create a low resistance region 32A in which the oxide of a partial region of the spin barrier layer 18 is reduced, and the material is suitable to the manufacture of a storage element 3 having a low resistance region 32.

In the storage element 3 of the tenth to twelfth embodiments, the first electrode layer 19A is formed using at least one of Ru, Cu, W, Pt, Pd, Cr, TiN, TaN, TiC and ITO, and the second electrode layer 19B is formed using at least one of Ti, Ta, Nb, Zr, Hf and Y. According to these materials, the oxide in a part in the spin barrier layer 18 that contacts the first electrode layer 19A is not easily reduced, and it is possible to form the low resistance region 32 by reducing the oxide in parts that contact or approach the second electrode layer 19B.

For the storage element 3 of the first to twelfth embodiments, the spin barrier layer 18 is formed using at least one of MgO, $Al_2O_3$, and $SiO_2$. In so doing, it is possible to obtain favorable interface magnetization anisotropy between the storage layer 17 and the spin barrier layer 18.

For the storage element 3 of the first to twelfth embodiments, the set film thickness value of the spin barrier layer 18 is 0.6 nm or more and 0.7 nm or less. In so doing, it is possible to realize a storage element 3 with low surface resistance and a favorable coercive force.

In the storage element 3 of the first to twelfth embodiments, the storage layer 17 is formed using at least one of FeCoB, FeNiB, FeCoC, FeCoSiB, FeAlSi, CoMnSi and MnAl. These materials are suitable for perpendicular magnetization of the storage layer 17.

The storage device of the embodiment includes the above-described storage element 3 that holds information according to the magnetization state of a magnetic body, and two types of wiring (1 and 6) that intersect one another. The storage element 3 is arranged between the two types of wiring (1 and 6), and the storage device is configured so that a current flows in the stacking direction to the storage element 3 through the two types of wiring (1 and 6).

A non-volatile memory able to operate as a low voltage and a low current is created in which the storage element 3 has excellent coercive characteristics as described above. Accordingly, the storage device of the embodiment is able to reduce the write current and reduce the power consumed when writing to the storage element 3 is performed. A memory cell is configured from the storage element 3, and it is possible to reduce the power consumption of the memory overall.

It is possible to realize a highly reliable storage device with excellent information holding characteristics that operates stably with low power consumption.

The storage device with the configuration shown in FIG. 1 and including the storage element 3 described as the first to twelfth embodiments has the advantage of being able to be manufactured by applying a general semiconductor MOS formation process. The storage device of the embodiment is suitable to application as a general purpose memory.

The method of manufacturing of the thirteenth to seventeenth embodiments includes the following steps.

A first step of stacking the magnetization fixing layer 15, the tunnel barrier layer 16, the storage layer 17, and the spin barrier layer 18 in order (FIGS. 8A and 9A).

A second step of stacking the first electrode layer 19A on the spin barrier layer 18 (FIGS. 8A and 9A)

A third step of filling an insulating material 20 in the periphery of the above layer structured body, working the upper surfaces of the first electrode layer 19A and the insulating material 20 to a state of being substantially flat or the upper surface of the insulating material 20 to a state of projecting further than the upper surface of the first electrode layer 19A (FIGS. 8B and 8C, and FIGS. 9E and 9F).

A fourth step of removing or thinning a portion of the first electrode layer 19A (FIGS. 8D, 10A, 11A, 12A, and 13D)

A fifth step of stacking the second electrode layer 19B on the first electrode layer 19A in which a portion is removed or thinned (FIGS. 8E and 8F, 10B and 10C, 11B and 11C, 12C and 12D, and 14B and 14C)

In this case, it is possible to comparatively easily manufacture the structure of the storage element 3 of the first to twelfth embodiments by stacking the second electrode layer 19B in the fifth step after a portion of the first electrode layer 19A is worked in the fourth step.

In the fourth step, by thinning a portion of the spin barrier layer 18 after removing a portion of the first electrode layer 19A, a low resistance region 30 (or 31) is formed by a portion of the spin barrier layer 18 being formed with a film thickness value lower than the set film thickness value. In so doing, it is possible to obtain a layer structure in which the electrode layer 19 enters the spin barrier layer 18, and, for example, the structure is suitable to the manufacture of the storage element 3 of the first to ninth embodiments.

A material with higher reactivity to oxide than the first electrode layer 19A is used in the second electrode layer 19B, a portion of the second electrode layer 19B that is stacked in fifth step contacts or approaches the spin barrier layer 18 by passing through or entering the first electrode layer 19A of which a portion is removed or thinned in the fourth step in the film thickness direction, and thereby it is possible to form the low resistance region 32 by an oxide in a partial region in the spin barrier layer 18 being reduced. In so doing, it is possible to generate a region with a low resistance value as a portion of the spin barrier layer 18, and the region is suitable to the manufacturing of the storage element 3 of the tenth to twelfth embodiments.

6. Modification Examples

Although the embodiments have been described above, the technology of the present disclosure is not limited to the layer structure of the storage element 3 described in the above embodiments, and various layer structures may be employed.

For example, a configuration with the electrode layer 19 made from three or more layers of different materials may be used.

The storage layer 17 and the magnetization fixing layer 15, may be a single layer made from a ferromagnetic body, such as FeCoB, or may have the multilayer structure as in the sample in FIG. 15.

The underlayer 14 may have a single material or a stacked structure with a plurality of materials.

Although the structure of the storage element 3 of the disclosure is a configuration of a magneto-resistance effect element, such as a tunneling magneto-resistance (TMR) element, the magneto-resistance effect element as the TMR element is able to be applied not only to the above-described storage device, but also to a magnetic head and a hard disk drive mounted with the magnetic head, an integrated circuit chip, and further various electronic devices and electrical devices, such as a personal computer, a mobile terminal, a mobile telephone, and a magnetic sensor device.

Figure 19A:
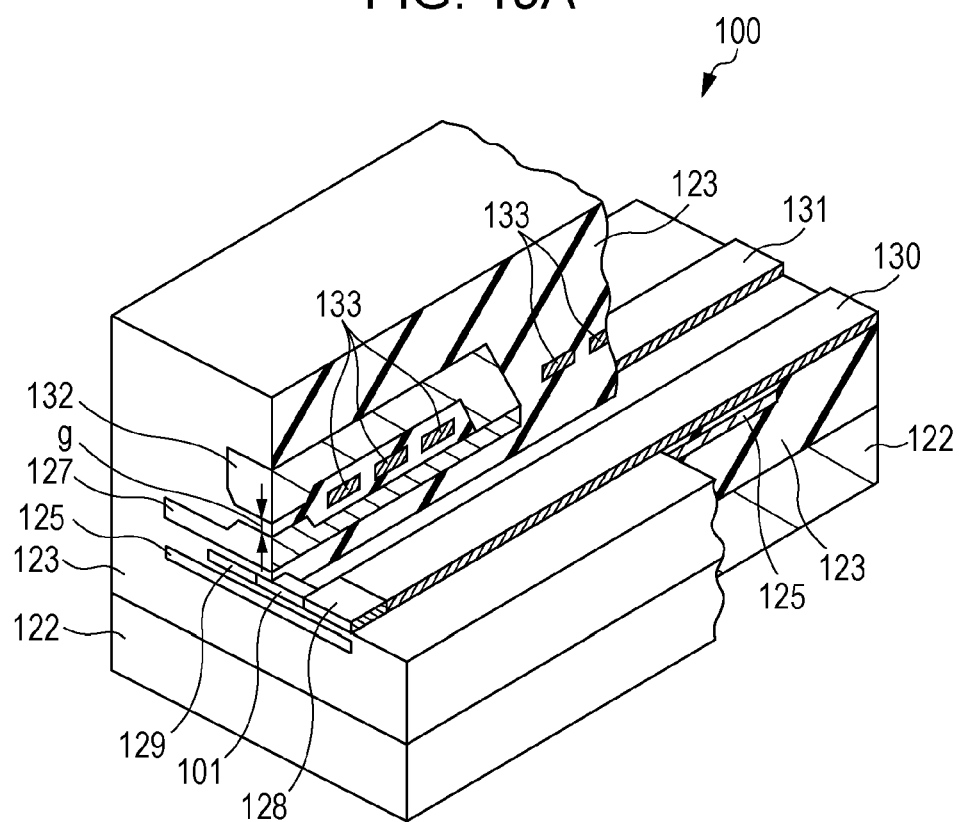
FIGS. 19A and 19B are explanatory diagrams of an embodiment of a magnetic head.
Figure 19B:
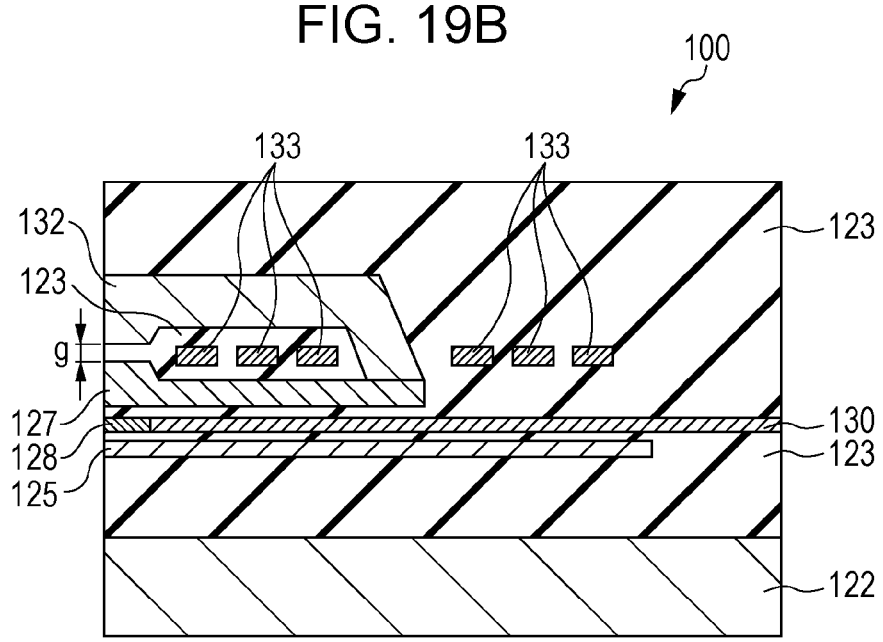

FIGS. 19A and 19B show an example in which the magneto-resistance effect element 101 with the structure of the storage element 3 is applied to a complex magnetic head 100. FIG. 19A is a perspective view showing a composite magnetic head 100 in which a portion is notched such that the internal structure thereof may be understood, and FIG. 19B is a cross-sectional view of the composite magnetic head 100.

The composite magnetic head 100 is a magnetic head used in a hard disk device or the like where the magneto-resistance effect magnetic head to which the technology of the disclosure is applied is formed on a substrate 122 and an inductive magnetic head is stacked and formed on the magneto-resistance effect magnetic head along. The magneto-resistance effect magnetic head operates as a reproducing head, and the inductive magnetic head operates as a recording head. In other words, the composite magnetic head 100 is configured as a composite of a reproducing head and a recording head.

The magneto-resistance effect magnetic head mounted to the composite magnetic head 100 is a so-called shielded MR head, and includes a first magnetic shield 125 formed via an insulating layer 123 on a substrate 122, a magneto-resistance effect element 101 formed via an insulating layer 123 on the first magnetic shield 125, and a second magnetic shield 127 formed via an insulating layer 123 on the magneto-resistance effect element 101. The insulating layer 123 is formed from an insulating material such as $Al_2O_3$ or $SiO_2$.

The first magnetic shield 125 is for magnetically shielding the lower layer side of the magneto-resistance effect element 101, and is formed from a soft magnetic material such as Ni—Fe. A magneto-resistance effect element 101 is formed on the first magnetic shield 125 via the insulating layer 123.

The magneto-resistance effect element 101 functions as a magnetically sensitive element that detects magnetic signals from a magnetic recording medium in the magneto-resistance effect magnetic head. The magneto-resistance effect element 101 has the same film configuration as the above-described storage element 3.

The magneto-resistance effect element 101 is formed in a substantially rectangular shape, and is formed such that one side surface thereof is exposed to the opposing surface of a magnetic recording medium. Biasing layers 128 and 129 are arranged on both ends of the magneto-resistance effect element 101. Connection terminals 130 and 131 connected to the biasing layers 128 and 129 are formed. A sense current is supplied to the magneto-resistance effect element 101 via the connection terminals 130 and 131.

A second magnetic shield layer 127 is provided via the insulating layer 123 on the upper portion of the biasing layers 128 and 129.

The inductive magnetic head stacked and formed on the magneto-resistance effect magnetic head as above includes a magnetic core configured by the second magnetic shield 127 and an upper layer core 132, and a thin film coil 133 formed so as to be wrapped around the magnetic core.

The upper layer core 132 forms a closed magnetic circuit with the second magnetic shield 122, is the magnetic core of an inductive magnetic head, and is formed from a soft magnetic material, such as Ni—Fe. The second magnetic shield 127 and the upper layer core 132 have the front end portions thereof exposed opposite surface of the magnetic recording medium, and are formed such that the second magnetic shield 127 and the upper layer core 132 contact one another at the rear end portions thereof. The front end portions of the second magnetic shield 127 and the upper layer core 132 are formed such that the second magnetic shield 127 and the upper layer core 132 are separated by a predetermined gap g in the opposing surface of a magnetic recording medium.

In other words, in the composite magnetic head 100, the second magnetic shield 127 not only magnetically shields the upper layer side of the magneto-resistance effect element 126, but also functions as a magnetic core of the inductive magnetic head, and the magnetic core of the inductive magnetic head is configured by the second magnetic shield 127 and the upper layer core 132. The gap g is a recording magnetic gap of the inductive magnetic head.

A thin film coil 133 embedded in the insulating layer 123 is formed on the second magnetic shield 127. The thin film coil 133 is formed so as be wound around a magnetic core formed from the second magnetic shield 127 and the upper layer core 132. Although not shown in the drawings, both end portions of the thin film coil 133 are formed so as to be exposed to the outside, and the terminals formed at both ends of the thin film coil 133 are terminals for external connection of the inductive magnetic head. In other words, during recording of a magnetic signal to the magnetic recording medium, a recording current is supplied to the thin film coil 133 from the terminals for external connection.

Although the composite magnetic head 100 as above has the magneto-resistance effect magnetic head mounted as the reproducing head, the magneto-resistance effect magnetic head includes the magneto-resistance effect element 101 to which the technology of the disclosure is applied as the magnetically sensitive element that detects magnetic signals from a magnetic recording medium. Since the magneto-resistance effect element 101 to which the technology of the disclosure is applied show the extremely superior characteristics as described above, the magneto-resistance effect magnetic head is able to respond to further increased high recording density in magnetic recording.

Here, the present application may also adopt the following configurations.

(1) A storage element including a layer structure, the layer structure including a storage layer including magnetization perpendicular to the film surface, in which the direction of magnetization is changed corresponding to information; a magnetization fixing layer including magnetization perpendicular to the film surface that becomes a reference for information stored on the storage layer; a tunnel barrier layer made from an oxide provided between the storage layer and the magnetization fixing layer; and a spin barrier layer made from an oxide provided contacting the surface of the opposite side of the storage layer to the surface contacting the tunnel barrier layer; in which a low resistance region is formed in a portion of the spin barrier layer formed with a predetermined set film thickness value and storage of information on the storage layer is performed by changing the direction of magnetization of the storage layer by current flowing in the stacking direction of the layer structure.

(2) The storage element according to (1) in which the spin barrier layer is set as the low resistance region by being formed so that a partial film thickness value is a lower value than the set film thickness value.

(3) The storage element according to (2), in which an electrode layer is provided on the surface side of the spin barrier layer opposite to the surface that contacts the storage layer, and in which a portion of the electrode layer is formed so as to enter with respect to the spin barrier layer in the film thickness direction, and formed so that the film thickness value of the entering portion of the spin barrier layer is a lower value than the set film thickness value.

(4) The storage element according to (3), in which the electrode layer is formed by a plurality of layers including a first electrode layer and a second electrode layer that are stacked in order from the spin barrier layer side, and in which a portion of the second electrode layer is formed so as to enter with respect to the spin barrier layer in the film thickness direction after passing through the first electrode layer in the film thickness direction.

(5) The storage element according to (2) in which an electrode layer is provided on the surface side of the spin barrier layer opposite to the surface that contacts the storage layer, and in which a portion of the electrode layer is formed so as to contact the storage layer by passing through the spin barrier layer in the film thickness direction, and formed so that the film thickness value of the passage portion of the spin barrier layer is a lower value than the set film thickness value.

(6) The storage element according to (5), in which the electrode layer is formed by a plurality of layers including a first electrode layer and a second electrode layer that are stacked in order from the spin barrier layer side, and in which a portion of the second electrode layer is formed so as to contact the storage layer by passing through spin barrier layer in the film thickness direction after passing through the first electrode layer in the film thickness direction.

(7) The storage element according to (2) to (6), in which the spin barrier layer is set as the low resistance region by being formed so that the film thickness value is a value lower than the set film thickness value in one or both of a center region and a peripheral region of a film surface.

(8) The storage element according to (1), in which the low resistance region is formed by an oxide being reduced in a partial region of the spin barrier layer.

(9) The storage element according to (8), in which an electrode layer configured to have a plurality of layers including a first electrode layer and a second electrode layer in which different materials are stacked in order from the spin barrier layer side is provided on the surface side of the spin barrier layer opposite to the surface that contacts the storage layer, in which the second electrode layer is made from a material with a higher reactivity to an oxide than the first electrode layer, and in which the low resistance region is formed by an oxide in a partial region in the spin barrier layer being reduced by a portion of the second electrode layer contacting or approaching the spin barrier layer by passing through or entering the first electrode layer in the film thickness direction.

(10) The storage element according to (9), in which the first electrode layer is formed using at least one of Ru, Cu, W, Pt, Pd, Cr, TiN, TaN, TiC and ITO, and in which the second electrode layer is formed using at least one of Ti, Ta, Nb, Zr, Hf and Y.

(11) The storage element according to (1) to (10), in which the spin barrier layer is formed using at least one of MgO, $Al_2O_3$, and $SiO_2$.

(12) The storage element according to (1) to (11), in which the set film thickness values is 0.6 nm or more and 0.7 nm or less.

(13) The storage element according to (1) to (12), in which the storage layer is formed using at least one of FeCoB, FeNiB, FeCoC, FeCoSiB, FeAlSi, CoMnSi and MnAl.

(14) A storage device that includes a storage element that holds information through the magnetization state of a magnetic material; and two types of wiring that intersect one another, in which the storage element includes a layer structure including a storage layer including magnetization parallel to a film surface, in which a direction of magnetization is changed corresponding to the information, a magnetization fixing layer including magnetization perpendicular to the film surface that becomes a reference for information stored on the storage layer, a tunnel barrier layer made from an oxide provided between the storage layer and the magnetization fixing layer, and a spin barrier layer made from an oxide provided contacting the surface of the opposite side of the storage layer to the surface contacting the tunnel barrier layer, and in which a low resistance region is formed in a portion of the spin barrier layer formed with a predetermined set film thickness value, and storage of information on the storage layer is performed by the direction of magnetization of the storage layer being changed by a current flowing in the stacking direction of the layer structure, in which the storage element is arranged between the two types of wiring, and in which a current flows in the stacking direction to the storage element through the two types of wiring.

(15) A method of manufacturing a storage element including a layer structure which includes a storage layer including magnetization perpendicular to the film surface, in which the direction of magnetization is changed corresponding to information, a magnetization fixing layer including magnetization perpendicular to the film surface that becomes a reference for information stored on the storage layer, a tunnel barrier layer made from an oxide provided between the storage layer and the magnetization fixing layer, and a spin barrier layer made from an oxide provided contacting the surface of the opposite side of the storage layer to the surface contacting the tunnel barrier layer, and in which a low resistance region is formed in a portion of the spin barrier layer formed with a predetermined set film thickness value and storage of information on the storage layer is performed by changing the direction of magnetization of the storage layer by current flowing in the stacking direction of the layer structure, the method including a first step of stacking the magnetization fixing layer, the tunnel barrier layer, the storage layer and the spin barrier layer in order; a second step of stacking a first electrode layer on the spin barrier layer; a third step of filling an insulating material in the periphery of a structure body due to the stacking, and working upper surfaces of the first electrode layer and the insulating material to be substantially flat, or the upper surface of the insulating material to project further than the upper surface of the first electrode layer; a fourth step of removing or thinning a portion of the first electrode layer, and a fifth step of stacking a second electrode layer on the first electrode layer in which a portion is removed or thinned.

(16) The method of manufacturing a storage element according to (15), in which the spin barrier layer is formed so that the low resistance region is formed by the film thickness value of a portion thereof being set to a lower value than the set film thickness value by thinning or removing a portion of the spin barrier layer after a portion of the first electrode layer is removed in the fourth step.

(17) The method of manufacturing of a storage element according to (15), in which a material with a higher reactivity to oxide than the first electrode layer is used in the second electrode layer, and in which the low resistance region is formed by an oxide in a partial region in the spin barrier layer being reduced by a portion of the second electrode layer that is stacked in the fifth step contacting or approaching the spin barrier layer by passing through or entering the first electrode layer of which a portion is removed or thinned in the fourth step in the film thickness direction.

(18) A magnetic head including a storage element, wherein the storage element includes a layer structure including: a storage layer including magnetization perpendicular to the film surface, in which the direction of magnetization is changed corresponding to information; a magnetization fixing layer including magnetization perpendicular to the film surface that becomes a reference for information stored on the storage layer; a tunnel barrier layer made from an oxide provided between the storage layer and the magnetization fixing layer; and a spin barrier layer made from an oxide provided contacting a surface of the opposite side of the storage layer to the surface contacting the tunnel barrier layer, and in which a low resistance region is formed in a portion of the spin barrier layer formed with a predetermined set film thickness value.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage element comprising a layer structure, the layer structure including:
    a storage layer including magnetization perpendicular to the film surface, in which the direction of magnetization is changed corresponding to information;
    a magnetization fixing layer including magnetization perpendicular to the film surface that becomes a reference for information stored on the storage layer;
    a tunnel barrier layer made from an oxide provided between the storage layer and the magnetization fixing layer; and
    a spin barrier layer made from an oxide provided contacting the surface of the opposite side of the storage layer to the surface contacting the tunnel barrier layer,
    wherein a low resistance region is formed in a portion of the spin barrier layer formed with a predetermined set film thickness value and storage of information on the storage layer is performed by changing the direction of magnetization of the storage layer by current flowing in the stacking direction of the layer structure,
    wherein the spin barrier layer is set as the low resistance region by being formed so that a partial film thickness value is a lower value than the set film thickness value,
    wherein an electrode layer is provided on the surface side of the spin barrier layer opposite to the surface that contacts the storage layer,
    wherein a portion of the electrode layer is formed so as to enter with respect to the spin barrier layer in the film thickness direction, and formed so that the film thickness value of the entering portion of the spin barrier layer is a lower value than the set film thickness value,
    wherein the electrode layer is formed by a plurality of layers including a first electrode layer and a second electrode layer that are stacked in order from the spin barrier layer side, and
    wherein a portion of the second electrode layer is formed so as to enter with respect to the spin barrier layer in the film thickness direction after passing through the first electrode layer in the film thickness direction.

2. The storage element according to claim 1,
    wherein an electrode layer is provided on the surface side of the spin barrier layer opposite to the surface that contacts the storage layer, and
    wherein a portion of the electrode layer is formed so as to contact the storage layer by passing through the spin barrier layer in the film thickness direction, and formed so that the film thickness value of the passage portion of the spin barrier layer is a lower value than the set film thickness value.

3. The storage element according to claim 2,
    wherein the electrode layer is formed by a plurality of layers including a first electrode layer and a second electrode layer that are stacked in order from the spin barrier layer side, and
    wherein a portion of the second electrode layer is formed so as to contact the storage layer by passing through spin barrier layer in the film thickness direction after passing through the first electrode layer in the film thickness direction.

4. The storage element according to claim 1,
    wherein the spin barrier layer is set as the low resistance region by being formed so that the film thickness value is a value lower than the set film thickness value in one or both of a center region and a peripheral region of a film surface.

5. The storage element according to claim 1,
    wherein the low resistance region is formed by an oxide being reduced in a partial region of the spin barrier layer.

6. The storage element according to claim 5,
    wherein an electrode layer configured to have a plurality of layers including a first electrode layer and a second electrode layer in which different materials are stacked in order from the spin barrier layer side is provided on the surface side of the spin barrier layer opposite to the surface that contacts the storage layer,
    wherein the second electrode layer is made from a material with a higher reactivity to an oxide than the first electrode layer, and
    wherein the low resistance region is formed by an oxide in a partial region in the spin barrier layer being reduced by a portion of the second electrode layer contacting or approaching the spin barrier layer by passing through or entering the first electrode layer in the film thickness direction.

7. The storage element according to claim 6,
    wherein the first electrode layer is formed using at least one of Ru, Cu, W, Pt, Pd, Cr, TiN, TaN, TiC and ITO, and
    wherein the second electrode layer is formed using at least one of Ti, Ta, Nb, Zr, Hf and Y.

8. The storage element according to claim 1,
    wherein the spin barrier layer is formed using at least one of MgO, $Al_2O_3$, and $SiO_2$.

9. The storage element according to claim 1,
    wherein the set film thickness values is 0.6 nm or more and 0.7 nm or less.

10. The storage element according to claim 1,
wherein the storage layer is formed using at least one of FeCoB, FeNiB, FeCoC, FeCoSiB, FeAlSi, CoMnSi and MnAl.

11. A storage device comprising:
a storage element that holds information through the magnetization state of a magnetic material; and
two types of wiring that intersect one another,
wherein the storage element includes a layer structure including
a storage layer including magnetization parallel to a film surface, in which a direction of magnetization is changed corresponding to the information,
a magnetization fixing layer including magnetization perpendicular to the film surface that becomes a reference for information stored on the storage layer,
a tunnel barrier layer made from an oxide provided between the storage layer and the magnetization fixing layer, and
a spin barrier layer made from an oxide provided contacting the surface of the opposite side of the storage layer to the surface contacting the tunnel barrier layer, and
wherein a low resistance region is formed in a portion of the spin barrier layer formed with a predetermined set film thickness value, and storage of information on the storage layer is performed by the direction of magnetization of the storage layer being changed by a current flowing in the stacking direction of the layer structure,
wherein the spin barrier layer is set as the low resistance region by being formed so that a partial film thickness value is a lower value than the set film thickness value,
wherein an electrode layer is provided on the surface side of the spin barrier layer opposite to the surface that contacts the storage layer,
wherein a portion of the electrode layer is formed so as to enter with respect to the spin barrier layer in the film thickness direction, and formed so that the film thickness value of the entering portion of the spin barrier layer is a lower value than the set film thickness value,
wherein the electrode layer is formed by a plurality of layers including a first electrode layer and a second electrode layer that are stacked in order from the spin barrier layer side,
wherein a portion of the second electrode layer is formed so as to enter with respect to the spin barrier layer in the film thickness direction after passing through the first electrode layer in the film thickness direction,
wherein the storage element is arranged between the two types of wiring, and
wherein a current flows in the stacking direction to the storage element through the two types of wiring.

12. A magnetic head comprising a storage element, wherein the storage element includes a layer structure including:
a storage layer including magnetization perpendicular to the film surface, in which the direction of magnetization is changed corresponding to information;
a magnetization fixing layer including magnetization perpendicular to the film surface that becomes a reference for information stored on the storage layer;
a tunnel barrier layer made from an oxide provided between the storage layer and the magnetization fixing layer; and
a spin barrier layer made from an oxide provided contacting a surface of the opposite side of the storage layer to the surface contacting the tunnel barrier layer, and
wherein a low resistance region is formed in a portion of the spin barrier layer formed with a predetermined set film thickness value,
wherein the spin barrier layer is set as the low resistance region by being formed so that a partial film thickness value is a lower value than the set film thickness value,
wherein an electrode layer is provided on the surface side of the spin barrier layer opposite to the surface that contacts the storage layer,
wherein a portion of the electrode layer is formed so as to enter with respect to the spin barrier layer in the film thickness direction, and formed so that the film thickness value of the entering portion of the spin barrier layer is a lower value than the set film thickness value,
wherein the electrode layer is formed by a plurality of layers including a first electrode layer and a second electrode layer that are stacked in order from the spin barrier layer side, and
wherein a portion of the second electrode layer is formed so as to enter with respect to the spin barrier layer in the film thickness direction after passing through the first electrode layer in the film thickness direction.

13. A storage element comprising a layer structure, the layer structure including:
a storage layer including magnetization perpendicular to the film surface, in which the direction of magnetization is changed corresponding to information;
a magnetization fixing layer including magnetization perpendicular to the film surface that becomes a reference for information stored on the storage layer;
a tunnel barrier layer made from an oxide provided between the storage layer and the magnetization fixing layer; and
a spin barrier layer made from an oxide provided contacting the surface of the opposite side of the storage layer to the surface contacting the tunnel barrier layer,
wherein a low resistance region is formed in a portion of the spin barrier layer formed with a predetermined set film thickness value and storage of information on the storage layer is performed by changing the direction of magnetization of the storage layer by current flowing in the stacking direction of the layer structure,
wherein an electrode layer is provided on the surface side of the spin barrier layer opposite to the surface that contacts the storage layer,
wherein a portion of the electrode layer is formed so as to contact the storage layer by passing through the spin barrier layer in the film thickness direction, and formed so that the film thickness value of the passage portion of the spin barrier layer is a lower value than the set film thickness value,
wherein the electrode layer is formed by a plurality of layers including a first electrode layer and a second electrode layer that are stacked in order from the spin barrier layer side, and
wherein a portion of the second electrode layer is formed so as to contact the storage layer by passing through spin barrier layer in the film thickness direction after passing through the first electrode layer in the film thickness direction.

14. A storage element comprising a layer structure, the layer structure including:
a storage layer including magnetization perpendicular to the film surface, in which the direction of magnetization is changed corresponding to information;

a magnetization fixing layer including magnetization perpendicular to the film surface that becomes a reference for information stored on the storage layer;

a tunnel barrier layer made from an oxide provided between the storage layer and the magnetization fixing layer; and a spin barrier layer made from an oxide provided contacting the surface of the opposite side of the storage layer to the surface contacting the tunnel barrier layer, wherein a low resistance region is formed in a portion of the spin barrier layer formed with a predetermined set film thickness value and storage of information on the storage layer is performed by changing the direction of magnetization of the storage layer by current flowing in the stacking direction of the layer structure, wherein the low resistance region is formed by an oxide being reduced in a partial region of the spin barrier layer, wherein an electrode layer configured to have a plurality of layers including a first electrode layer and a second electrode layer in which different materials are stacked in order from the spin barrier layer side is provided on the surface side of the spin barrier layer opposite to the surface that contacts the storage layer, wherein the second electrode layer is made from a material with a higher reactivity to an oxide than the first electrode layer, and wherein the low resistance region is formed by an oxide in a partial region in the spin barrier layer being reduced by a portion of the second electrode layer contacting or approaching the spin barrier layer by passing through or entering the first electrode layer in the film thickness direction.

* * * * *